United States Patent
Fujioka et al.

(10) Patent No.: US 12,504,688 B2
(45) Date of Patent: Dec. 23, 2025

(54) NEGATIVE PHOTOSENSITIVE RESIN COMPOSITION AND METHOD FOR MANUFACTURING CURED RELIEF PATTERN

(71) Applicant: ASAHI KASEI KABUSHIKI KAISHA, Tokyo (JP)

(72) Inventors: Takanobu Fujioka, Tokyo (JP); Takeki Shimizu, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 381 days.

(21) Appl. No.: 17/793,751

(22) PCT Filed: Jan. 27, 2021

(86) PCT No.: PCT/JP2021/002821
§ 371 (c)(1),
(2) Date: Jul. 19, 2022

(87) PCT Pub. No.: WO2021/153608
PCT Pub. Date: Aug. 5, 2021

(65) Prior Publication Data
US 2023/0110416 A1 Apr. 13, 2023

(30) Foreign Application Priority Data
Jan. 30, 2020 (JP) .................................. 2020-013856

(51) Int. Cl.
G03F 7/038 (2006.01)
C08G 73/10 (2006.01)
C08G 73/12 (2006.01)
G03F 7/38 (2006.01)
G03F 7/40 (2006.01)

(52) U.S. Cl.
CPC ....... *G03F 7/0387* (2013.01); *C08G 73/1042* (2013.01); *C08G 73/1046* (2013.01); *C08G 73/12* (2013.01); *C08G 73/124* (2013.01); *G03F 7/0382* (2013.01); *G03F 7/0388* (2013.01); *G03F 7/38* (2013.01); *G03F 7/40* (2013.01)

(58) Field of Classification Search
CPC .......... G03F 7/037; G03F 7/0388; G03F 7/30; G03F 7/40; C08G 73/10; C08G 73/14; C08G 73/1042; C08G 73/1046; C08G 73/12; C08G 73/124; C08F 290/145
See application file for complete search history.

(56) References Cited

U.S. PATENT DOCUMENTS

| | | | | |
|---|---|---|---|---|
| 5,270,431 | A | * | 12/1993 | Blum .................... C08G 18/348 528/69 |
| 2005/0124093 | A1 | | 6/2005 | Yang et al. |
| 2008/0057446 | A1 | | 3/2008 | Goto et al. |
| 2018/0120702 | A1 | * | 5/2018 | Urano ...................... C07C 69/76 |
| 2018/0215874 | A1 | | 8/2018 | Kawabata et al. |
| 2018/0275513 | A1 | * | 9/2018 | Takemura ............ C09D 179/08 |
| 2019/0018320 | A1 | | 1/2019 | Urano et al. |
| 2019/0072851 | A1 | | 3/2019 | Tanigaki et al. |
| 2019/0080994 | A1 | | 3/2019 | Im |
| 2019/0163061 | A1 | | 5/2019 | Chen et al. |
| 2020/0019057 | A1 | | 1/2020 | Fukuhara et al. |
| 2021/0116809 | A1 | | 4/2021 | Tsuchiya et al. |

FOREIGN PATENT DOCUMENTS

| | | |
|---|---|---|
| CN | 104285184 A | 1/2015 |
| CN | 105765453 A | 7/2016 |
| EP | 0 574 934 A1 | 12/1993 |
| JP | S59-212833 | 12/1984 |
| JP | S59-212834 | 12/1984 |
| JP | H02-157845 A | 6/1990 |
| JP | H11-38617 | 2/1999 |
| JP | H11-38619 | 2/1999 |
| JP | H11-160870 A | 6/1999 |
| JP | 2004-133435 | 4/2004 |
| JP | 2005-167191 | 6/2005 |
| JP | 2008-050401 | 3/2008 |
| JP | 2008-83468 | 4/2008 |
| JP | 2011-059656 | 3/2011 |
| JP | 2017-194677 | 10/2017 |
| KR | 10-2018-0030921 A | 3/2018 |

(Continued)

OTHER PUBLICATIONS

International Search Report issued in International Patent Application No. PCT/JP2021/002821, dated Apr. 20, 2021, along with an English translation thereof.

(Continued)

*Primary Examiner* — John S. Chu
(74) *Attorney, Agent, or Firm* — GREENBLUM & BERNSTEIN, P.L.C.

(57) ABSTRACT

Provided are: a negative photosensitive resin composition with which high resolution properties are exhibited when a relief pattern is formed on copper wiring, imidization adequately progresses even when the curing temperature is low, and a cured relief pattern having good adhesion to copper wiring can be manufactured; and a method for manufacturing a cured relief pattern using the negative photosensitive resin composition. This negative photosensitive resin composition contains (A) a polyimide precursor including specific structural units which are represented by general formula (1) and which have a univalent organic group having a urea structure, and (B) a photopolymerization initiator.

24 Claims, No Drawings

(56) References Cited

FOREIGN PATENT DOCUMENTS

| KR | 10-2019-0029828 A | 3/2019 |
| KR | 10-2019-0120320 A | 10/2019 |
| KR | 10-2019-0129828 A | 11/2019 |
| TW | 201945439 | 12/2019 |
| WO | 2017/159876 | 9/2017 |
| WO | 2018/038001 | 3/2018 |
| WO | 2018/123836 | 7/2018 |
| WO | 2019/107250 | 6/2019 |
| WO | 2019/163860 | 8/2019 |

OTHER PUBLICATIONS

International Preliminary Report on Patentability in International Application No. PCT/JP2021/002821, dated Jul. 28, 2022, along with an English translation thereof.

Editor: Peng Anshun et al., Fine Organic Chemistry, punlished by Petroleum University Press (Aug. 1996), ISBN 7-5636-0870-2/O-41, p. 195, lines 2 to 3, partial translation.

* cited by examiner

NEGATIVE PHOTOSENSITIVE RESIN COMPOSITION AND METHOD FOR MANUFACTURING CURED RELIEF PATTERN

TECHNICAL FIELD

The present disclosure relates to a negative photosensitive resin composition and a method for producing a cured relief pattern.

BACKGROUND ART

Polyimide resins, which have excellent heat resistance, electrical properties and mechanical properties, have hitherto been used as insulating materials of electronic components as well as passivation films, surface protective films and interlayer insulating films of semiconductor devices. Of these polyimide resins, those provided in the form of a photosensitive polyimide precursor composition can be used to easily form a heat-resistant relief pattern film by a thermal imidization treatment due to coating, exposure, development and curing of the composition. Such photosensitive polyimide precursor compositions are characterized in that they can significantly reduce processes as compared with conventional non-photosensitive polyimide materials.

By the way, semiconductor devices (hereinafter also referred to as "elements") are mounted on a printed circuit board by various methods according to purposes. Conventional elements have commonly been produced by a wire bonding method in which a thin wire is used to connect an external terminal (pad) of the element to a lead frame. However, in recent years, the speed of the element has increased and the operating frequency has reached GHz levels, and thus a difference in wiring length of each terminal in mounting affects the operation of the element. Therefore, in the mounting of the element for high-end applications, it became necessary to accurately control the length of the mounting wiring, leading to difficulty in satisfying the demand by wire bonding.

Thus, there has been proposed flip-chip mounting in which a rewiring layer is formed on a surface of a semiconductor chip and bumps (electrodes) are formed thereon, and then the chip is flipped and mounted directly on a printed circuit board. Since wiring distance can be accurately controlled, flip-chip mounting is used in elements for high-end applications which handle high-speed signals, or in mobile phones because of small mounting size thereof, and demand therefor is rapidly expanding. More recently, there has been proposed a semiconductor chip mounting technique called a fan-out wafer level package (FOWLP) in which a pre-processed wafer is diced to produce individual chips and the individual chips are reconstructed on a support, followed by sealing with a mold resin and further peeling-off the support to form a rewiring layer (for example, PTL 1). FOWLP has the advantage of being capable of reducing the height of a package and achieving high-speed transmission and cost reduction.

CITATION LIST

Patent Literature

[PTL 1] JP 2005-167191 A

SUMMARY

Technical Problem

However, due to the diversification of the package mounting technique in recent years, the types of supports have become diversified and rewiring layers are formed in multiple layers, so that a focus depth in exposing the photosensitive resin composition shifts, thus causing a problem that a resolution significantly deteriorates. An adhesion between copper wiring and a polyimide layer is also important, but a decrease in curing temperature leads to a problem that an imidization rate and the adhesion to copper are decreased.

Therefore, it is an object of the present disclosure to provide a negative photosensitive resin composition which exhibits a high resolution when a relief pattern is formed on copper wiring and allows imidization to sufficiently proceed even at a low curing temperature, thus making it possible to produce a cured relief pattern with satisfactory adhesion to copper wiring, and a method for producing a cured relief pattern using the negative photosensitive resin composition.

Solution to Problem

The present inventors have found that the problems can be solved by combining a polyimide precursor which has a side chain having a urea structure with a photopolymerization initiator. Examples of the embodiments of the present invention are mentioned below.

[1]

A negative photosensitive resin composition comprising:
(A) a polyimide precursor having a structural unit represented by the following general formula (1), and
(B) a photopolymerization initiator:

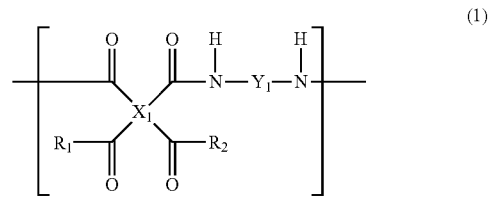

wherein, in formula (1), $X_1$ is a tetravalent organic group having 4 to 40 carbon atoms, $Y_1$ is a divalent organic group having 6 to 40 carbon atoms, and $R_1$ and $R_2$ are each independently selected from the group consisting of a hydroxyl group, a monovalent organic group having 1 to 40 carbon atoms and having no urea structure, and a monovalent organic group having a urea structure, in which at least one of $R_1$ and $R_2$ is the monovalent organic group having a urea structure.

[2]

The negative photosensitive resin composition according to item 1, further comprising (A') a polyimide precursor having a structural unit represented by the following general formula (1'):

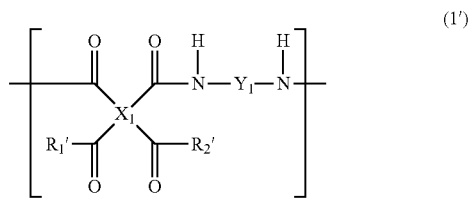

(1')

wherein, in formula (1'), $X_1$ is a tetravalent organic group having 4 to 40 carbon atoms, $Y_1$ is a divalent organic group having 6 to 40 carbon atoms, and $R_1'$ and $R_2'$ are each independently selected from the group consisting of a hydroxyl group and a monovalent organic group having 1 to 40 carbon atoms and having no urea structure.

[3]

The negative photosensitive resin composition according to item 1 or 2, wherein the polyimide precursor (A) is a copolymer having a structural unit represented by the general formula (1) and a structural unit represented by the following general formula (1'):

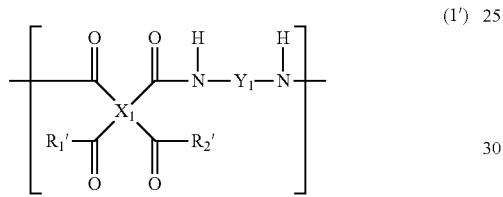

(1')

wherein, in formula (1'), $X_1$ is a tetravalent organic group having 4 to 40 carbon atoms, $Y_1$ is a divalent organic group having 6 to 40 carbon atoms, and $R_1'$ and $R_2'$ are each independently selected from the group consisting of a hydroxyl group and a monovalent organic group having 1 to 40 carbon atoms and having no urea structure.

[4]

The negative photosensitive resin composition according to any one of items 1 to 3, comprising the photopolymerization initiator (B) in the amount of 0.1 parts by weight to 20 parts by weight based on 100 parts by weight of the polyimide precursor (A), or based on 100 parts by weight of the total of the polyimide precursor (A) and the polyimide precursor (A') when the polyimide precursor (A') is contained.

[5]

The negative photosensitive resin composition according to any one of items 1 to 4, wherein any one of $R_1$ and $R_2$ in the polyimide precursor (A) is a monovalent organic group having a urea structure, and the other is a monovalent organic group having 1 to 40 carbon atoms and having no urea structure.

[6]

The negative photosensitive resin composition according to any one of items 1 to 5, wherein the ratio of the monovalent organic group having a urea structure in the polyimide precursor (A) is 0.1 mol % to 95 mol % relative to the total amount of $R_1$ and $R_2$.

[7]

The negative photosensitive resin composition according to any one of items 1 to 6, wherein the monovalent organic group having 1 to 40 carbon atoms and having no urea structure is represented by the following general formula (2):

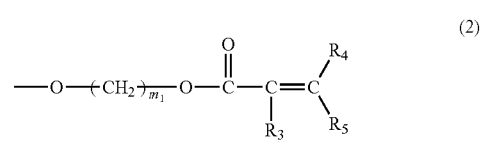

(2)

wherein $R_3$, $R_4$ and $R_5$ are each independently a hydrogen atom or an organic group having 1 to 3 carbon atoms, and $m_1$ is an integer of 2 to 10.

[8]

The negative photosensitive resin composition according to any one of items 1 to 7, wherein the monovalent organic group having a urea structure further has a (meth)acrylic group.

[9]

The negative photosensitive resin composition according to any one of items 1 to 8, wherein the monovalent organic group having a urea structure is represented by the following general formula (3):

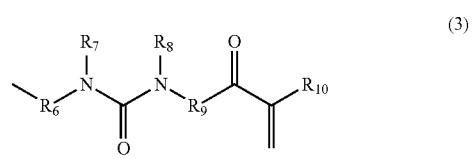

(3)

wherein $R_6$ and $R_9$ are each independently a divalent organic group having 1 to 10 carbon atoms, and $R_7$, $R_8$ and $R_{10}$ each independently represent a hydrogen atom or a monovalent organic group having 1 to 6 carbon atoms.

[10]

The negative photosensitive resin composition according to any one of items 1 to 9, wherein the monovalent organic group having a urea structure is at least one selected from the group consisting of the following general formulas (4) to (7):

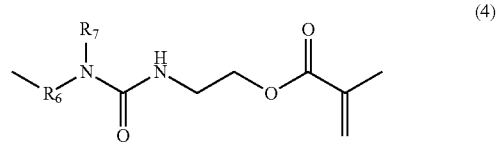

(4)

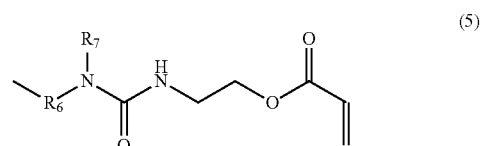

(5)

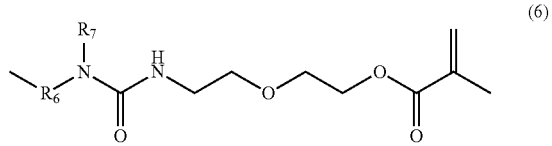

(6)

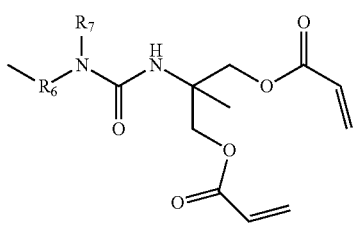

wherein $R_6$ is a divalent organic group having 1 to 10 carbon atoms, and $R_7$ is a hydrogen atom or a monovalent organic group having 1 to 10 carbon atoms.

[11]
The negative photosensitive resin composition according to any one of items 1 to 10, wherein the ratio of the monovalent organic group having a urea structure to the total amount of $R_1$ and $R_2$ in the polyimide precursor (A) is 5 mol % or more to 75 mol % or less.

[12]
The negative photosensitive resin composition according to any one of items 1 to 11, wherein the photopolymerization initiator (B) is an oxime compound.

[13]
The negative photosensitive resin composition according to any one of items 1 to 12, wherein the photopolymerization initiator (B) is represented by the following general formula (19) or (20):

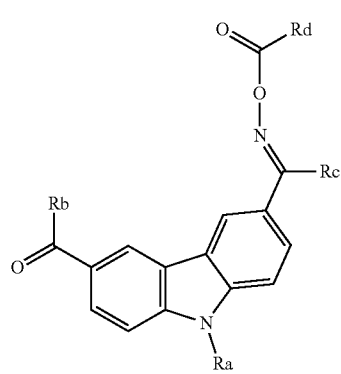

wherein Ra represents a monovalent organic group having 1 to 10 carbon atoms, Rb represents a monovalent organic group having 1 to 20 carbon atoms, Rc represents a monovalent organic group having 1 to 10 carbon atoms, and Rd represents a monovalent organic group having 1 to 10 carbon atoms; and

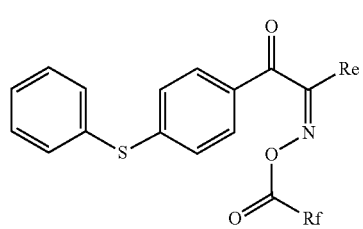

wherein Re represents a monovalent organic group having 1 to 20 carbon atoms, and Rf represents a monovalent organic group having 1 to 10 carbon atoms.

[14]
The negative photosensitive resin composition according to any one of items 1 to 13, further comprising (C) a photopolymerizable unsaturated monomer.

[15]
The negative photosensitive resin composition according to any one of items 1 to 14, wherein $X_1$ is at least one selected from the group consisting of the following general formulas (8) to (11):

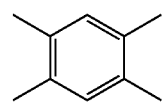

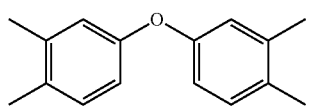

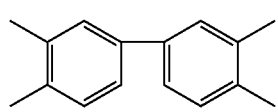

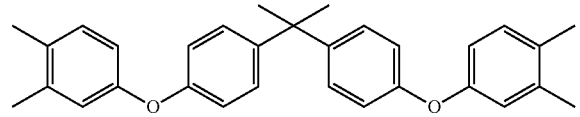

[16]
The negative photosensitive resin composition according to any one of items 1 to 15, wherein $Y_1$ is at least one selected from the group consisting of the following general formulas (12) to (15):

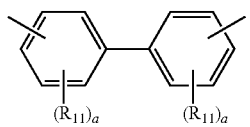

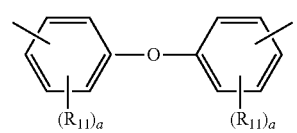

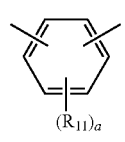

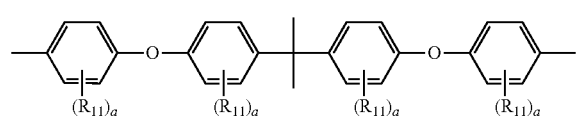

wherein $R_{11}$ is each independently a monovalent organic group having 1 to 10 carbon atoms, and a is each independently an integer of 0 to 4.

[17]
The negative photosensitive resin composition according to any one of items 1 to 16, further comprising (D) a rust inhibitor in the amount of 0.01 to 20 parts by weight based on 100 parts by weight of the polyimide precursor (A), or based on 100 parts by weight of the total of the polyimide precursor (A) and the polyimide precursor (A') when the polyimide precursor (A') is contained.

[18]

The negative photosensitive resin composition according to any one of items 1 to 17, further comprising (E) a compound having a urethane bond or a urea bond in the amount of 0.1 to 30 parts by weight based on 100 parts by weight of the polyimide precursor (A), or based on 100 parts by weight of the total of the polyimide precursor (A) and the polyimide precursor (A') when the polyimide precursor (A') is contained.

[19]

A method for producing a polyimide, which comprises a step of curing the negative photosensitive resin composition according to any one of items 1 to 18 to form a polyimide.

[20]

A method for producing a cured relief pattern, which comprises the following steps:
(1) a step of applying the negative photosensitive resin composition according to any one of items 1 to 19 onto a substrate to form a photosensitive resin layer on the substrate,
(2) a step of exposing the photosensitive resin layer,
(3) a step of developing the exposed photosensitive resin layer to form a relief pattern, and
(4) a step of subjecting the relief pattern to a heat treatment to form a cured relief pattern.

[21]

The method for producing a cured relief pattern according to item 20, wherein an imidization rate in the heat treatment of step (4) at 150° C. to 250° C. is 60% or more.

[22]

A polyimide precursor having a structural unit represented by the following general formula (1):

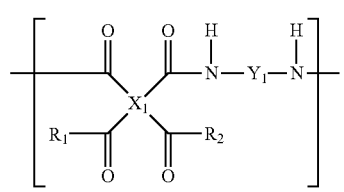

wherein, in formula (1), $X_1$ is a tetravalent organic group having 4 to 40 carbon atoms, $Y_1$ is a divalent organic group having 6 to 40 carbon atoms, and $R_1$ and $R_2$ are each independently selected from the group consisting of a hydrogen atom hydroxyl group, a monovalent organic group having 1 to 40 carbon atoms and having no urea structure and a monovalent organic group having a urea structure, in which at least one of $R_1$ and $R_2$ is the monovalent organic group having a urea structure.

[23]

The polyimide precursor according to item 22, wherein $X_1$ is at least one selected from the group consisting of the following general formulas (8) to (11), and $Y_1$ is at least one selected from the group consisting of the following general formulas (12) to (15):

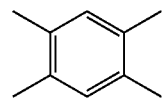
(8)

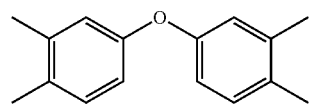
(9)

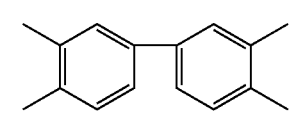
(10)

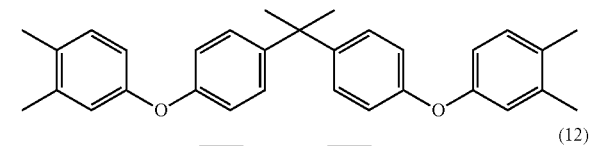
(11)

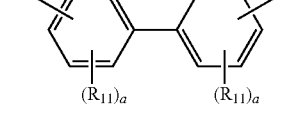
(12)

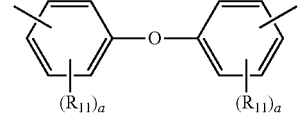
(13)

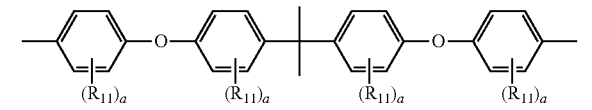
(14)

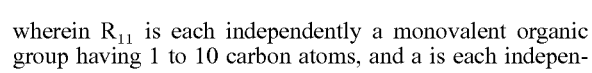
(15)

wherein $R_{11}$ is each independently a monovalent organic group having 1 to 10 carbon atoms, and a is each independently an integer of 0 to 4.

[24]

The polyimide precursor according to item 22 or 23, wherein the monovalent organic group having a urea structure is represented by the following general formula (3):

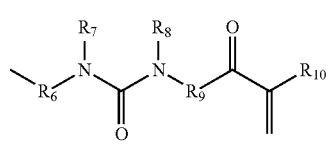
(3)

wherein $R_6$ and $R_9$ are each independently a divalent organic group having 1 to 10 carbon atoms, and $R_7$, $R_8$ and $R_{10}$ each independently represent a hydrogen atom or a monovalent organic group having 1 to 6 carbon atoms.

[25]

A negative photosensitive resin composition comprising:
(A) a polyimide precursor having a structural unit represented by the following general formula (1), and (B) a photopolymerization initiator:

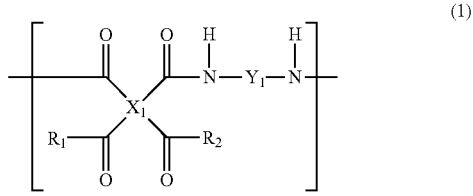

wherein, in formula (1), $X_1$ is a tetravalent organic group having 4 to 40 carbon atoms, $Y_1$ is a divalent organic group having 6 to 40 carbon atoms, and at least one of $R_1$ and $R_2$ represents a monovalent organic group derived from a compound having a volatilization rate of 14% to 40% at 170° C. for 2 hours of heating.

[26]

The negative photosensitive resin composition according to item 25, wherein the volatilization rate is 14% to 30%.

[27]

A negative photosensitive resin composition comprising a polyimide precursor and a photopolymerization initiator, wherein an imidization rate after heat-curing at 170° C. is 40% to 100%, and a peak-to-valley difference after applying onto a polyimide film having a thickness of 15 microns and a via size of 25 microns and heat-curing at 170° C. is 0.5 microns to 3.5 microns.

[28]

The negative photosensitive resin composition according to item 27, wherein the peak-to-valley difference is 0.5 microns to 2.5 microns.

Advantageous Effects of Invention

According to the present disclosure, there is provided a negative photosensitive resin composition which exhibits a high resolution when a relief pattern is formed on copper wiring and allows imidization to sufficiently proceed even at a low curing temperature, thus making it possible to produce a cured relief pattern with satisfactory adhesion to copper wiring, and a method for producing a cured relief pattern using the negative photosensitive resin composition.

DESCRIPTION OF EMBODIMENTS

<Negative Photosensitive Resin Composition>

The negative photosensitive resin composition of the present disclosure is a negative photosensitive resin composition comprising:
(A) a polyimide precursor having a structural unit represented by the following general formula (1), and
(B) a photopolymerization initiator:

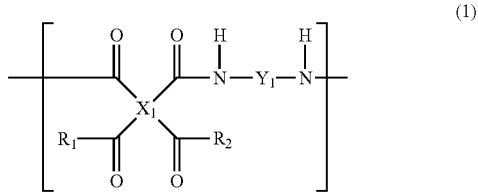

wherein, in formula (1), $X_1$ is a tetravalent organic group having 4 to 40 carbon atoms, $Y_1$ is a divalent organic group having 6 to 40 carbon atoms, and $R_1$ and $R_2$ are each independently selected from the group consisting of a hydroxyl group, a monovalent organic group having 1 to 40 carbon atoms and having no urea structure, and a monovalent organic group having a urea structure, in which at least one of $R_1$ and $R_2$ is the monovalent organic group having a urea structure. The organic group may be either an organic group having a heteroatom other than carbon and hydrogen, or an organic group composed of carbon and hydrogen atoms. Examples of the heteroatom include a nitrogen atom, an oxygen atom and a sulfur atom. Throughout the present specification, the structures represented by the same symbol in a general formula may be the same or different from each other when a plurality of structures exist in the molecule.

The negative photosensitive resin composition may comprise, in addition to the polyimide precursor (A), (A') a polyimide precursor having a structural unit represented by the following general formula (1'):

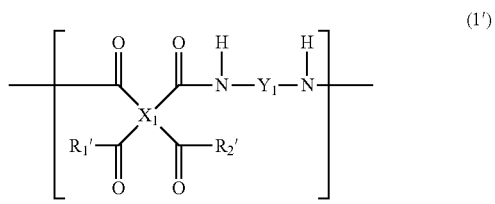

wherein, in formula (1'), $X_1$ is a tetravalent organic group having 4 to 40 carbon atoms, $Y_1$ is a divalent organic group having 6 to 40 carbon atoms, and $R_1'$ and $R_2'$ are each independently selected from the group consisting of a hydroxyl group and a monovalent organic group having 1 to 40 carbon atoms and having no urea structure. The organic group may be either an organic group having a heteroatom other than carbon and hydrogen, or an organic group composed of carbon and hydrogen atoms. Examples of the heteroatom include a nitrogen atom, an oxygen atom and a sulfur atom. When the polyimide precursor (A') is further contained, the mixing amount thereof is more than 0 and less than 100 wt. %, preferably more than 0 and less than 50 wt. %, more preferably more than 0 and less than 20 wt. %, and still more preferably more than 0 and less than 10 wt. %, when the total of the polyimide precursor (A) and the polyimide precursor (A') is 100 wt. %.

The polyimide precursor (A) may be a copolymer of structural units represented by the general formula (1) and the general formula (1'). The copolymer may be a random copolymer, a block copolymer, or a combination thereof. The copolymerization ratio (molar ratio) is as follows: m+n=100 when the total amount of general formula (1) is m mol, the total amount of general formula (1') is n mol, and m represents a number of more than 0 and less than 100 and n represents a number of more than 0 and less than 100. m is preferably 50 or more to less than 100, more preferably 80 or more to less than 100, and still more preferably 90 or more to less than 100, and n is preferably more than 0 and 50 or less, more preferably more than 0 and 20 or less, and still more preferably more than 0 and 10 or less.

As in the general formula (1), the polyimide precursor may be either a polyimide precursor in which at least one of $R_1$ and $R_2$ is a monovalent organic group having a urea structure, or a mixture of the general formula (1) and the general formula (1'), that is, a mixture (blend) of a polyimide precursor in which at least one of $R_1$ and $R_2$ is a monovalent organic group having a urea structure and a polyimide precursor in which $R_1'$ and $R_2'$ are a hydroxyl group or a monovalent organic group having 1 to 40 carbon atoms and having no urea structure. Alternatively, the polyimide precursor may be a copolymer of the general formula (1) and the general formula (1'), that is, a copolymer having a polyimide structure in which at least one of $R_1$ and $R_2$ is a monovalent organic group having a urea structure and a polyimide structure in which $R_1'$ and $R_2'$ are a hydroxyl group or a monovalent organic group having 1 to 40 carbon atoms and having no urea structure. Alternatively, the polyimide precursor may be a mixture of a polyimide precursor of the copolymer and the general formula (1').

The negative photosensitive resin composition of the present disclosure may be a negative photosensitive resin composition comprising:

(A) a polyimide precursor having a structural unit represented by the following general formula (1), and (B) a photopolymerization initiator:

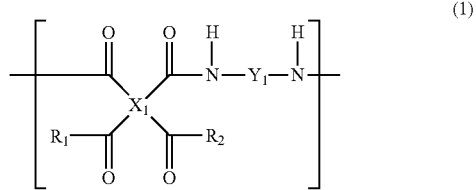

(1)

wherein, in formula (1), $X_1$ is a tetravalent organic group having 4 to 40 carbon atoms, $Y_1$ is a divalent organic group having 6 to 40 carbon atoms, and at least one of $R_1$ and $R_2$ represents a monovalent organic group derived from a compound having a volatilization amount at 170° C. for 2 hours of heating (hereinafter also simply referred to as "volatilization amount") is 14% to 40%. The volatilization amount can be measured by the method mentioned in the Examples mentioned later. At least one of $R_1$ and $R_2$ is derived from a compound having a volatilization amount is 14% to 40%, whereby the film obtained after heat-curing is excellent in chemical resistance and exhibits excellent elongation after a reliability test. From the viewpoint of the chemical resistance, the volatilization amount is preferably 38% or less, more preferably 35% or less, and particularly preferably 32% or less. From the viewpoint of the elongation after a reliability test, the volatilization amount is preferably 14% or more, more preferably 15% or more, and particularly preferably 16% or more. The compound in which the volatilization amount is 14% to 40% is preferably a urea compound used for synthesis of a polyimide precursor.

Although it is not clear why the film obtained after heat-curing is excellent in chemical resistance and exhibits excellent elongation after a reliability test when at least one of $R_1$ and $R_2$ is derived from a compound in which the volatilization amount is 14% to 40%, the present inventors think as follows. That is, at least one of $R_1$ and $R_2$ is derived from a compound in which the volatilization amount is 40% or less, whereby the organic groups of $R_1$ and/or $R_2$ tend to remain in the film even after heat-curing. The remaining organic groups interact with the polyimide film to improve the chemical resistance. When $R_1$ and/or $R_2$ have a functional group which has a strong interaction, such as a urea structure or a urethane structure, the chemical resistance tends to be further improved. At least one of $R_1$ and $R_2$ is derived from a compound in which the volatilization amount is 14% or more, whereby it is possible to suppress excessive interaction of the organic groups remaining after heat-curing to improve the elongation after a reliability test.

The negative photosensitive resin composition of the present disclosure is a negative photosensitive resin composition comprising a polyimide precursor and a photopolymerization initiator, wherein the imidization rate is 40% to 100% after heat-curing at 170° C., and a peak-to-valley difference is 0.5 microns to 3.5 microns after applying onto a polyimide film having a thickness of 15 microns and a via size of 25 microns and heat-curing at 170° C. The polyimide precursor is preferably the polyimide precursor (A) of the present disclosure, the polyimide precursor (A) of the copolymer, or a mixture of these and the polyimide precursor (A').

The imidization rate can be calculated by the method mentioned in the Examples mentioned later. By setting the imidization rate at 40% to 100%, for example, there is a tendency to suppress peeling between the copper wiring and the polyimide film in the reflow process during the production process of producing a fan-out wafer level package, and therefore it is preferable. From the viewpoint of suppressing the peeling, the imidization rate is preferably 50% or more, and more preferably 60% or more. From the viewpoint of the elongation after heat-curing, the imidization rate is preferably 98% or less, and more preferably 95% or less.

The peak-to-valley difference can be calculated by the method mentioned in the Examples mentioned later. By setting the peak-to-valley difference at 3.5 microns or less, for example, it is possible to sufficiently secure the yield at the time of forming a copper wiring during the production process of producing a fan-out wafer level package having multiple polyimide layers. The peak-to-valley difference is preferably 3.0 microns or less, and more preferably 2.5 microns or less. By setting the peak-to-valley difference at 0.5 microns or more, there is a tendency to suppress crack generation when multiple polyimide layers are formed. The peak-to-valley difference is preferably 0.7 microns or more, and more preferably 0.9 microns or more.

Polyimide Precursor (A)

The polyimide precursor (A) is a resin component which is contained in the negative photosensitive resin composition and is represented by the general formula (1), and is converted into a polyimide by subjecting to a heat cyclization treatment.

In general formula (1), the tetravalent organic group represented by $X_1$ is preferably an organic group having 6 to 40 carbon atoms in view of achieving both heat resistance and photosensitive properties. More preferably, $X_1$ is an aromatic group or an alicyclic aliphatic group in which a —$COR_1$ group, a —$COR_2$ group and a —CONH— group are in the ortho-position to each other. Examples of the tetravalent organic group represented by $X_1$ include an organic group having 6 to 40 carbon atoms and having an aromatic ring, and specific examples thereof include, but are not limited to, groups having structures each represented by the following general formulas ($X_1$-1) and ($X_1$-2):

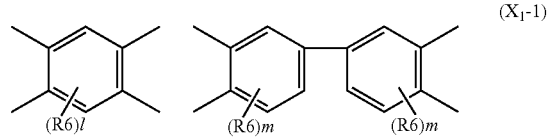

($X_1$-1)

-continued

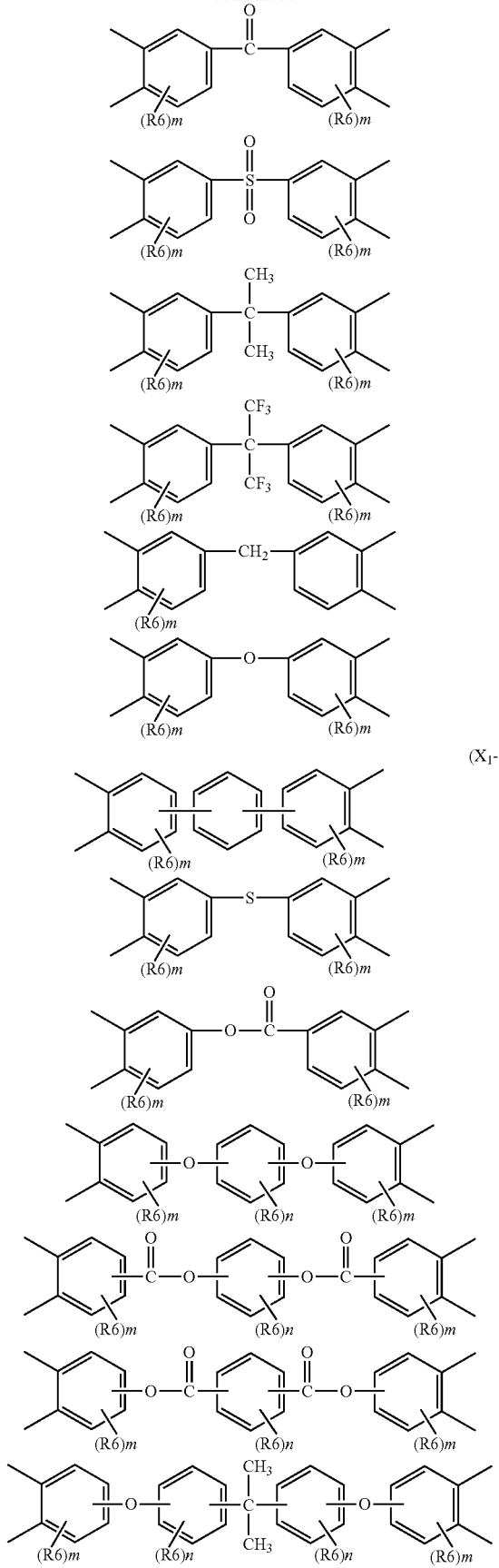

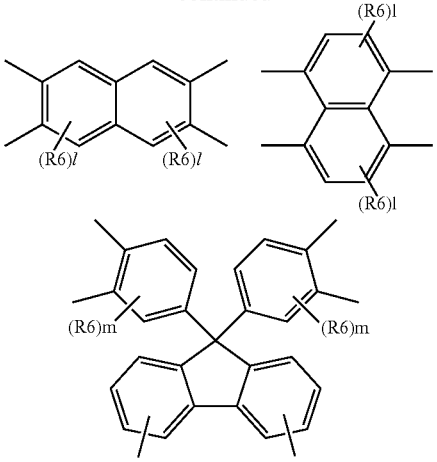

($X_1$-2)

wherein, in formulas ($X_1$-1) and ($X_1$-2), $R_6$ is a monovalent group selected from the group consisting of a hydrogen atom, a fluorine atom, a $C_1$-$C_{10}$ hydrocarbon group and a $C_1$-$C_{10}$ fluorine-containing hydrocarbon group, l is an integer selected from 0 to 2, m is an integer selected from 0 to 3, and n is an integer selected from 0 to 4. The structure of $X_1$ may be alone, or a combination of two or more thereof. The $X_1$ group having the structures each represented by the formulas ($X_1$-1) and ($X_1$-2) is particularly preferable in view of achieving both heat resistance and photosensitive properties, and a structure each represented by the formula ($X_1$-1) is more preferable.

Of the structures represented by the formulas ($X_1$-1) and ($X_1$-2), the $X_1$ group is particularly preferably a structure each represented by the following formula:

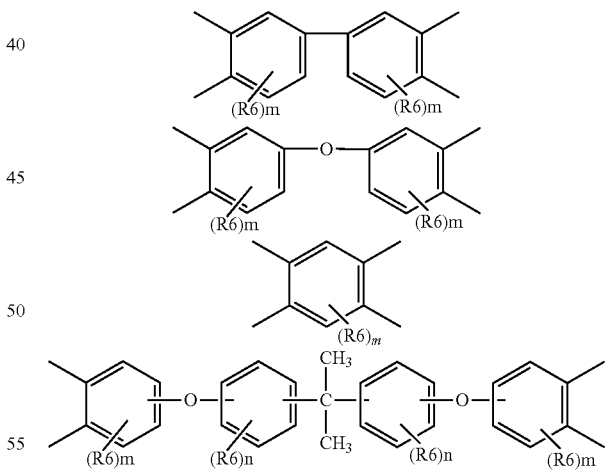

wherein R6 and m have the same meaning as R6 and m in the formulas ($X_1$-1) and ($X_1$-2), from the viewpoints of the imidization rate during low-temperature heating, degassing properties, copper adhesion and chemical resistance.

More specifically, from the viewpoints of the imidization rate, degassing properties, copper adhesion and chemical resistance, $X_1$ is more preferably at least one selected from the group consisting of the following general formulas (8) to (11).

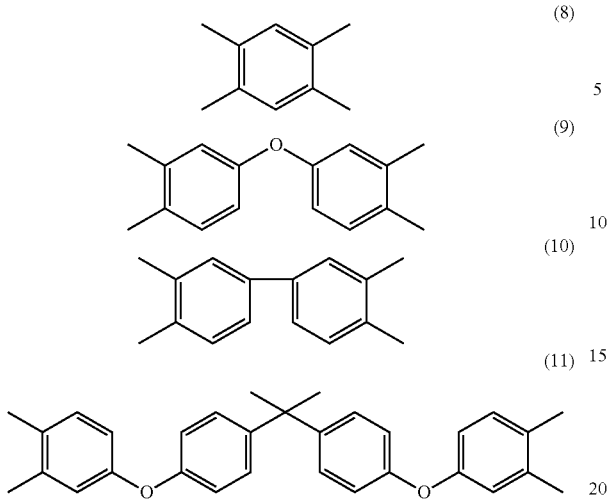
In the general formula (1), the divalent organic group represented by $Y_1$ is preferably an aromatic group having 6 to 40 carbon atoms in view of achieving both heat resistance and photosensitive properties. Examples of $Y_1$ include, but are not limited to, structures each represented by the following formulas ($Y_1$-1) and ($Y_1$-2):
($Y_1$-1)
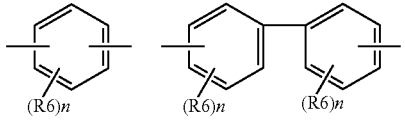
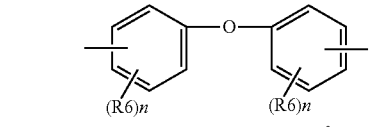
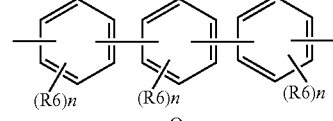
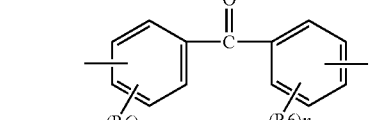
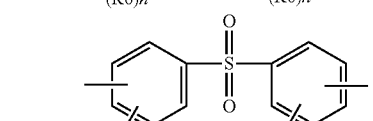
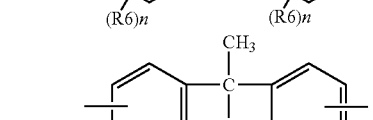
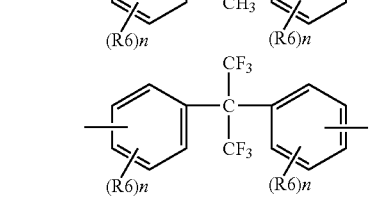
-continued
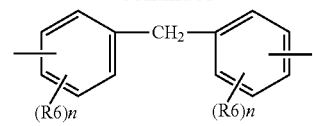
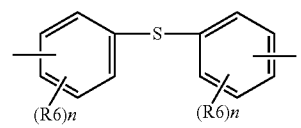
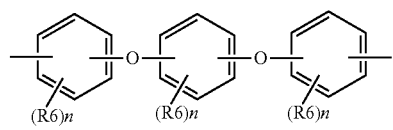
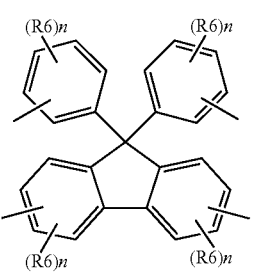
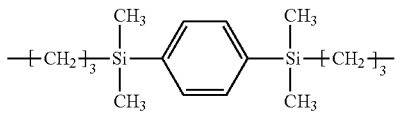
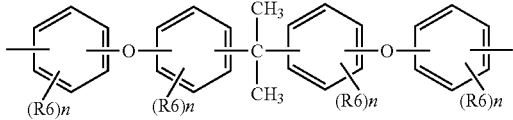
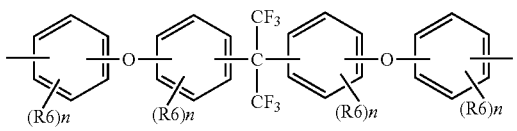
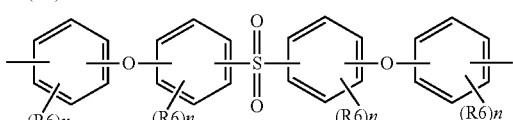
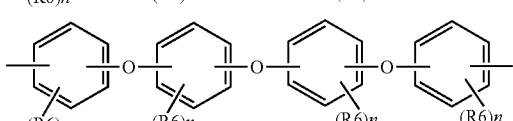
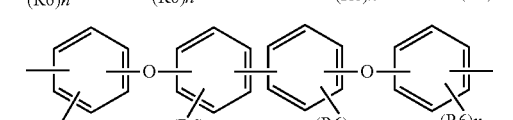
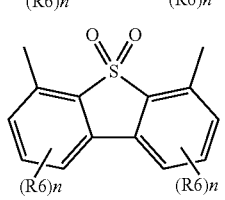

-continued

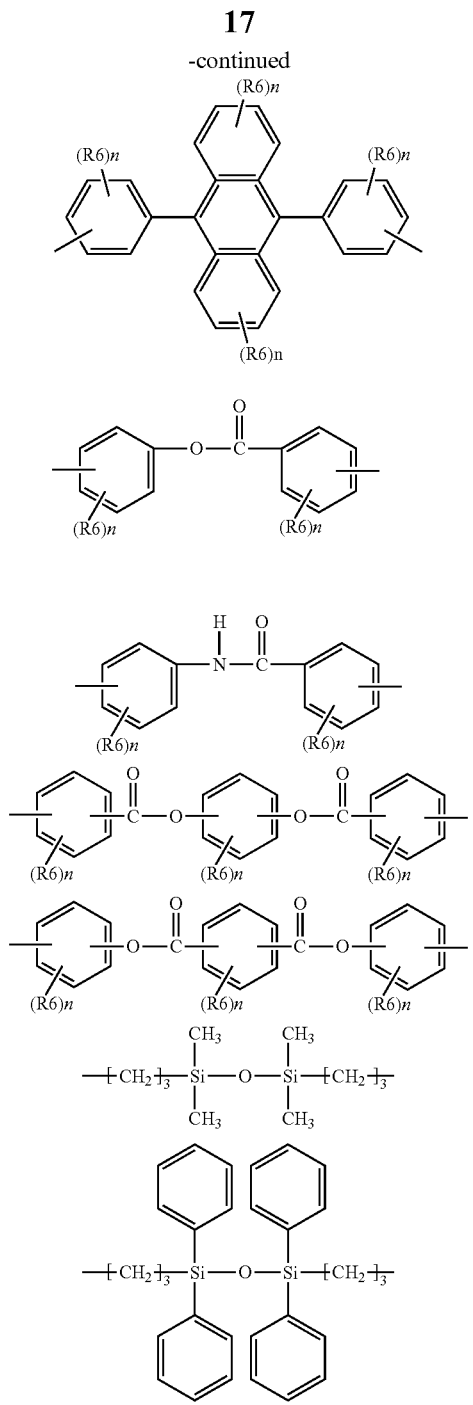

(Y₁-2)

wherein R6 is a monovalent group selected from the group consisting of a hydrogen atom, a fluorine atom, a $C_1$-$C_{10}$ hydrocarbon group and a $C_1$-$C_{10}$ fluorine-containing hydrocarbon group, and n is an integer selected from 0 to 4. The structure of $Y_1$ may be alone, or a combination of two or more thereof. The $Y_1$ group having the structures each represented by the formulas ($Y_1$-1) and ($Y_1$-2) is particularly preferable in view of achieving both heat resistance and photosensitive properties, and a structure each represented by the formula ($Y_1$-1) is more preferable.

Of the structures represented by the formula ($Y_1$-1), the $Y_1$ group particularly preferably has a structure each represented by the following formula:

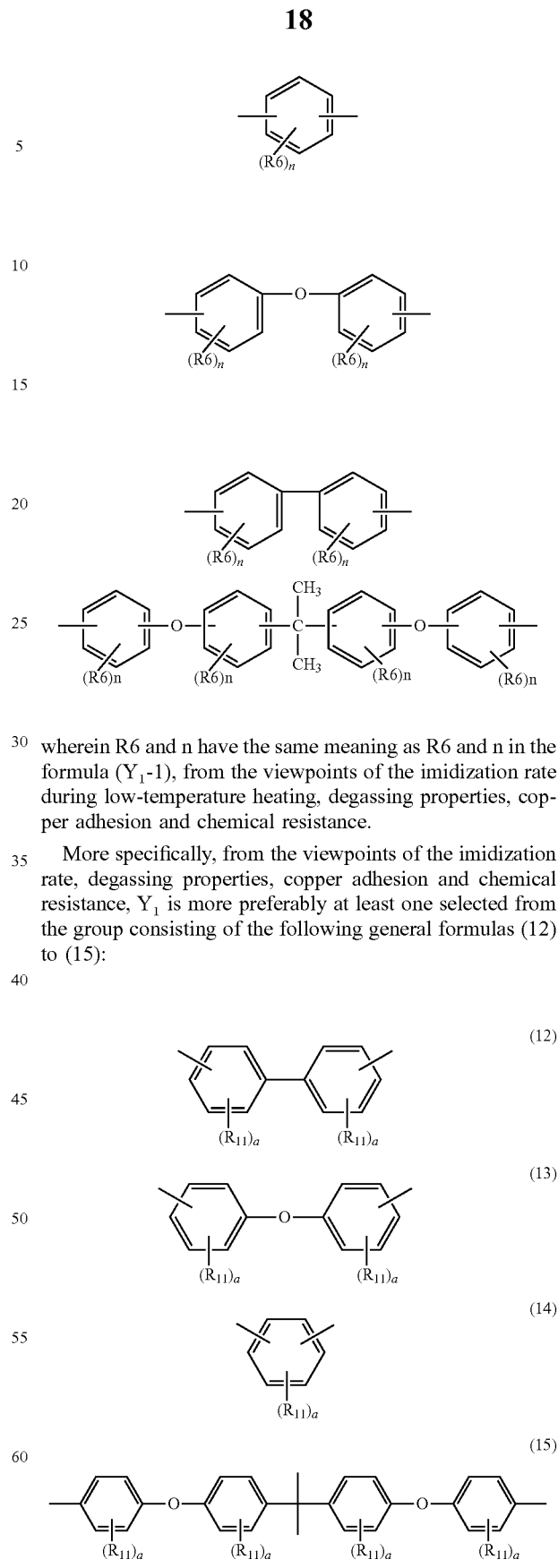

wherein R6 and n have the same meaning as R6 and n in the formula ($Y_1$-1), from the viewpoints of the imidization rate during low-temperature heating, degassing properties, copper adhesion and chemical resistance.

More specifically, from the viewpoints of the imidization rate, degassing properties, copper adhesion and chemical resistance, $Y_1$ is more preferably at least one selected from the group consisting of the following general formulas (12) to (15):

wherein $R_{11}$ is each independently a monovalent organic group having 1 to 10 carbon atoms, and a is each independently an integer of 0 to 4. $R_{11}$ may or may not contain a halogen atom.

At least one of $R_1$ and $R_2$ in the general formula (1) is preferably a group which further has a polymerizable group selected from the group consisting of an acid polymerizable group, a base polymerizable group and a radical polymerizable group. Here, the acid polymerizable group, the base polymerizable group and the radical polymerizable group mean a group which can be polymerized by the action of an acid, a base or a radical, respectively.

From the viewpoint of the resolution, it is preferable that $R_1$ and $R_2$ in the polyimide precursor (A) are each independently selected from a monovalent organic group having a urea structure or a monovalent organic group having 1 to 40 carbon atoms and having no urea structure. Both $R_1$ and $R_2$ may be monovalent organic groups having a urea structure, and it is preferable that one of $R_1$ and $R_2$ is a monovalent organic group having a urea structure, and the other is a monovalent organic group having 1 to 40 carbon atoms and having no urea structure.

From the viewpoints of the imidization rate, degassing properties, copper adhesion and chemical resistance, the monovalent organic group having 1 to 40 carbon atoms and having no urea structure is more preferably a group represented by the following general formula (2):

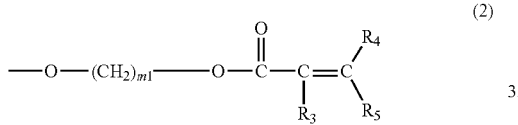

(2)

wherein $R_3$, $R_4$ and $R_5$ are each independently a hydrogen atom or an organic group having 1 to 3 carbon atoms, and $m_1$ is an integer of 2 to 10.

The monovalent organic group having a urea structure preferably has 1 to 40 carbon atoms. From the viewpoint of the resolution, the monovalent organic group having a urea structure preferably has, in addition to the urea structure, a polymerizable group selected from the group consisting of an acid polymerizable group, a base polymerizable group and a radical polymerizable group. From the viewpoint of the resolution, the polymerizable group is more preferably a (meth)acrylic group. The monovalent organic group having a urea structure is more preferably represented by the following general formula (3):

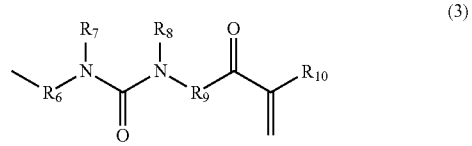

(3)

wherein $R_6$ and $R_9$ are each independently a divalent organic group having 1 to 10 carbon atoms, and $R_7$, $R_8$ and $R_{10}$ each independently represent a hydrogen atom or a monovalent organic group having 1 to 6 carbon atoms.

From the viewpoints of the imidization rate, copper adhesion and chemical resistance, the monovalent organic group having a urea structure may also be preferably at least one selected from the group consisting of the following general formulas (4) to (7):

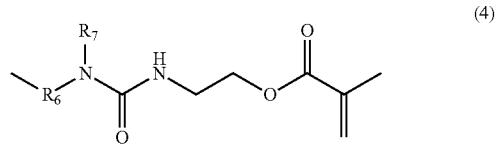

(4)

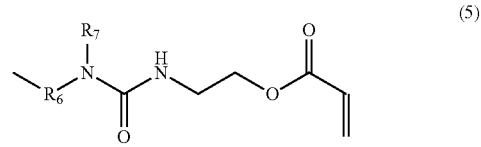

(5)

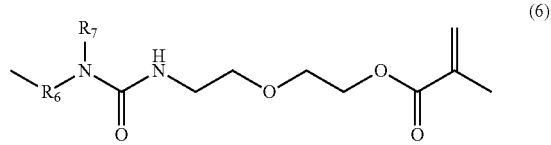

(6)

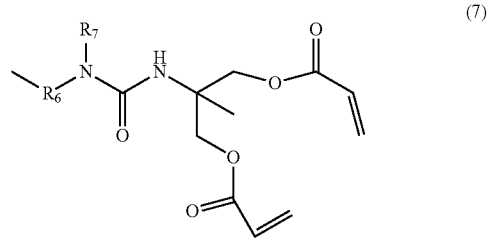

(7)

wherein $R_6$ is a divalent organic group having 1 to 10 carbon atoms, and $R_7$ is a hydrogen atom, a monovalent organic group having 1 to 10 carbon atoms or a monovalent organic group having 1 to 6 carbon atoms.

From the viewpoints of the imidization rate during low-temperature heating and resolution, the ratio of the monovalent organic group having a urea structure relative to the total amount of $R_1$ and $R_2$ is preferably 0.1 mol % or more to 95 mol % or less. When the ratio is 0.1 mol % or more, the progress of imidization is promoted, and when the ratio is 95 mol % or less, the resolution is more improved. The ratio is more preferably 1 mol % or more from the viewpoint of the chemical resistance, still more preferably 5 mol % or more from the viewpoint of promoting the progress of imidization, and particularly preferably 10 mol % or more from the viewpoint of reducing the peak-to-valley difference. The ratio is more preferably 90 mol % or less from the viewpoint of the resolution, still more preferably 75 mol % or less, and particularly preferably 70 mol % or less, from the viewpoint of the storage stability.

In one embodiment, the structural unit represented by the general formula (1) in the polyimide precursor (A) preferably includes a structural unit represented by the following general formula (1-1):

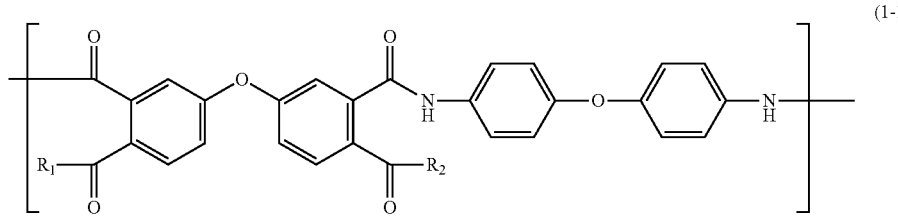

(1-1)

wherein, in formula (1-1), $R_1$ and $R_2$ are as defined in the general formula (1).

The structural unit represented by the general formula (1) in the polyimide precursor (A) includes a structural unit represented by general formula (1-1), whereby the chemical resistance of the obtained polyimide film is particularly enhanced. It is also preferable from the viewpoints of the imidization rate during low-temperature heating, degassing properties and copper adhesion.

In one embodiment, the structural unit represented by the general formula (1) in the polyimide precursor (A) preferably includes a structural unit represented by the following general formula (1-2):

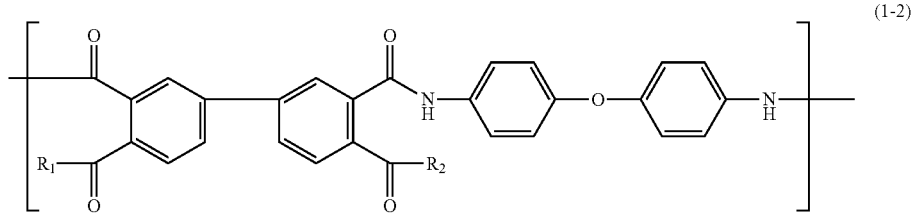

(1-2)

wherein $R_1$ and $R_2$ are as defined in the general formula (1).

The structural unit represented by the general formula (1) in the polyimide precursor (A) includes a structural unit represented by general formula (1-2), whereby the chemical resistance of the obtained polyimide film is particularly enhanced. It is also preferable from the viewpoints of the imidization rate during low-temperature heating, degassing properties and copper adhesion.

In one embodiment, the structural unit represented by the general formula (1) in the polyimide precursor (A) preferably includes a structural unit represented by the following general formula (1-3):

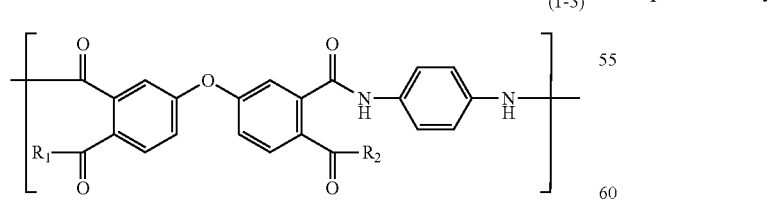

(1-3)

wherein $R_1$ and $R_2$ are as defined in the general formula (1).

The structural unit represented by the general formula (1) in the polyimide precursor (A) includes a structural unit represented by general formula (1-3), whereby the effect of improving the resolution is further enhanced. It is also preferable from the viewpoints of the imidization rate during low-temperature heating, degassing properties, copper adhesion and chemical resistance.

Method for Preparing Polyimide Precursor (A)

The method for preparing (A) a polyimide precursor comprises, for example:

reacting a tetracarboxylic dianhydride having the above-mentioned tetravalent organic group $X_1$, a compound having a urea group, and optionally, an alcohol having a polymerizable group selected from the group consisting of an acid polymerizable group, a base polymerizable group and a radical polymerizable group, and having no urea group, and optionally, other alcohols having no urea group to prepare a partially esterified tetracarboxylic acid (hereinafter also referred to as "acid/ester body"); and subjecting the partially esterified tetracarboxylic acid (acid/ester body), and a diamine having the above-mentioned divalent organic group $Y_1$ to amide polycondensation to obtain the polyimide precursor (A).

(Preparation of Acid/Ester Body)

The tetracarboxylic dianhydride having a tetravalent organic group $X_1$, which is suitably used for the preparation of the polyimide precursor (A), is preferably a compound represented by the following formula:

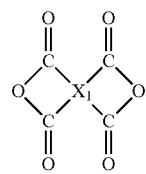

wherein $X_1$ is as defined in the general formula (1). This $X_1$ is more preferably selected from the structures each represented by the general formulas ($X_1$-1) and ($X_1$-2), and is still more preferably a structure represented by the general formula ($X_1$-1).

Preferred examples of the tetracarboxylic dianhydride include pyromellitic anhydride, diphenyl ether-3,3',4,4'-tetracarboxylic dianhydride (another name: oxydiphthalic dianhydride, abbreviation: "ODPA"), benzophenone-3,3',4,4'-tetracarboxylic dianhydride, biphenyl-3,3',4,4'-tetracarboxylic dianhydride (abbreviation: "BPDA"), diphenylsulfone-3,3',4,4'-tetracarboxylic dianhydride, diphenylmethane-3,3',4,4'-tetracarboxylic dianhydride, 2,2-bis(3,4-phthalic anhydride)propane and 2,2-bis(3,4-phthalic anhydride)-1,1,1,3,3,3-hexafluoropropane. More preferred examples of the tetracarboxylic dianhydride include, but are not limited to, pyromellitic anhydride, diphenyl ether-3,3', 4,4'-tetracarboxylic dianhydride, benzophenone-3,3',4,4'-tetracarboxylic dianhydride and biphenyl-3,3',4,4'-tetracarboxylic dianhydride. These may be used alone, or two or more thereof may be mixed and used.

Examples of the organic group having a polymerizable group selected from the group consisting of an acid polymerizable group, a base polymerizable group and a radical polymerizable group, and having no urea group, which is suitably used for the preparation of the polyimide precursor (A), include 2-hydroxyethyl methacrylate, 2-acryloyloxyethyl alcohol, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidoethyl alcohol, methylol vinyl ketone, 2-hydroxyethyl vinyl ketone, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate, 2-hydroxy-3-cyclohexyloxypropyl methacrylate, glycerol diacrylate, 1-(acryloyloxy)-3-(methacryloyloxy)-2-propanol, glycerol dimethacrylate, pentaerythritol triacrylate and pentaerythritol trimethacrylate.

The compound having a urea group, which is suitably used for the preparation of the polyimide precursor (A), is preferably a compound having, in addition to the urea group, a polymerizable group selected from the group consisting of an acid polymerizable group, a base polymerizable group and a radical polymerizable group, and more preferably a compound having, in addition to the urea group, a (meth) acrylic group.

The compound having a urea group can be synthesized from, for example, an isocyanate compound and an amine compound having a hydroxyl group. Examples of the isocyanate compound, which is used for the synthesis, include 2-isocyanatoethyl methacrylate, 1,1-(bisacryloyloxymethyl) ethyl isocyanate, 2-acryloyloxyethyl isocyanate, 2-(2-methacryloyloxyethyloxy)ethyl isocyanate and n-hexyl isocyanate. Examples of commercially available compounds thereof include Karenz MOI (registered trademark; Showa Denko K.K.), Karenz BEI (registered trademark; Showa Denko K.K.), Karenz AOI (registered trademark; Showa Denko K.K.) and Karenz MOI-EG (registered trademark; Showa Denko K.K.). Examples of the amine compound having a hydroxyl group include 2-aminoethoxyethanol, 1-aminoethanol and amino-PEG$_3$.

A non-photosensitive polyimide precursor prepared by reacting tetracarboxylic dianhydride with only an alcohol having no polymerizable group may be mixed with the polyimide precursor (A) and used. In this case, from the viewpoint of the resolution, the amount of the non-photosensitive polyimide precursor mixed is preferably 200 parts by weight or less based on 100 parts by weight of the photosensitive polyimide precursor.

By dissolving the tetracarboxylic dianhydride and the alcohol in a solvent, which is mentioned later, in the presence of an appropriate basic catalyst such as pyridine, followed by mixing, the esterification reaction of an acid anhydride group of the tetracarboxylic dianhydride proceeds, and thus the desired acid/ester body can be obtained. As reaction conditions, stirring is preferably continued at a temperature of 20 to 50° C., preferably for 4 to 10 hours.
(Preparation of Polyimide Precursor)

To the acid/ester body (typically in a state of a solution dissolved in a solvent mentioned later), an appropriate dehydration condensing agent is charged under ice cooling to convert the acid/ester body into a polyacid anhydride, and to this, a diamine having a divalent organic group $Y_1$ separately dissolved or dispersed in a solvent is added dropwise to carry out amide polycondensation, whereby the desired polyimide precursor can be obtained. Examples of the dehydration condensing agent include dicyclohexylcarbodiimide, 1-ethoxycarbonyl-2-ethoxy-1,2-dihydroquinoline, 1,1-carbonyldioxy-di-1,2,3-benzotriazole and N,N'-disuccinimidyl carbonate. Alternatively, the desired polyimide precursor can be obtained by reacting the acid/ester body, after acid chloridization of an acid moiety thereof using thionyl chloride, with a diamine in the presence of a base such as pyridine.

The diamine having a divalent organic group $Y_1$ is preferably a compound represented by formula:

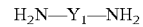

$$H_2N-Y_1-NH_2$$

wherein $Y_1$ is as defined in the general formula (1). This $Y_1$ more preferably has structures each represented by the general formulas ($Y_1$-1) and ($Y_1$-2).

More preferred examples of the diamine include, but are not limited to, p-phenylenediamine, m-phenylenediamine, 4,4-diaminodiphenyl ether (another name: 4,4'-oxydianiline, abbreviation: "ODA"), 3,4'-diaminodiphenyl ether, 3,3'-diaminodiphenyl ether, 4,4'-diaminodiphenylsulfide, 3,4'-diaminodiphenylsulfide, 3,3'-diaminodiphenylsulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl]ether, bis[4-(3-aminophenoxy)phenyl]ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, ortho-tolidine sulfone and 9,9-bis(4-aminophenyl)fluorene; and those in which a part of hydrogen atoms on the benzene ring thereof is substituted with a methyl group, an ethyl group, a hydroxymethyl group, a hydroxyethyl group or a halogen, such as 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4, 4'-diaminobiphenyl and 3,3'-dichloro-4,4'-diaminobiphenyl. These can be used alone, or two or more thereof may be mixed and used.

After completion of the amide polycondensation reaction, the water absorption by-products of the dehydration condensing agent present in the reaction solution are filtered as necessary, and then a poor solvent such as water, an aliphatic lower alcohol, or a mixed liquid thereof is charged into the obtained polymer component, whereby the polymer component can be precipitated. Furthermore, a redissolution or reprecipitation process is repeated, whereby the polymer is purified and vacuum-dried, and thus the target polyimide precursor can be isolated. In order to improve the degree of purification, a solution of the polymer may be passed through a column filled with an anion and/or cation exchange resin swollen with an appropriate organic solvent to remove ionic impurities.

The molecular weight of the polyimide precursor (A) is preferably 8,000 to 150,000, and more preferably 9,000 to 50,000, when measured by polystyrene-equivalent weight-average molecular weight by gel permeation chromatography. When the weight-average molecular weight is 8,000 or more, satisfactory mechanical physical properties are exhibited, and when the weight-average molecular weight is 150,000 or less, satisfactory dispersibility in a developer and satisfactory resolution of a relief pattern thereof are exhibited. Tetrahydrofuran and N-methyl-2-pyrrolidone are recommended as developing solvents for gel permeation chromatography. The weight-average molecular weight is also determined from a calibration curve prepared using standard monodisperse polystyrene. As the standard monodisperse polystyrene, it is recommended to select from the organic solvent-based standard sample "STANDARD SM-105" manufactured by Showa Denko K.K.

(B) Photopolymerization Initiator

The negative photosensitive resin composition comprises (B) a photopolymerization initiator. The photopolymerization initiator is preferably a photoradical polymerization initiator or a photoacid generator.

Examples of the photoradical polymerization initiator include benzophenone compounds such as benzophenone, methyl o-benzoylbenzoate, 4-benzoyl-4'-methyl diphenyl ketone, dibenzyl ketone and fluorenone; acetophenone compounds such as 2,2'-diethoxyacetophenone, 2-hydroxy-2-methylpropiophenone and 1-hydroxycyclohexyl phenyl ketone; thioxanthone compounds such as thioxanthone, 2-methylthioxanthone, 2-isopropylthioxanthone and diethylthioxanthone; benzyl compounds such as benzyl, benzyl dimethyl ketal and benzyl-β-methoxyethyl acetal; benzoin compounds such as benzoin and benzoin methyl ether; oxime compounds such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime and 1-phenyl-3-ethoxypropanetrione-2-(o-benzoyl)oxime; N-arylglycine compounds such as N-phenylglycine; peroxides such as benzoyl perchloride; aromatic biimidazole compounds; and titanocene compounds.

Preferred examples of the photoacid generator include α-(n-octanesulfonyloxyimino)-4-methoxybenzyl cyanide.

The photopolymerization initiator (B) is not limited the above examples. Of the above photopolymerization initiators, the photoradical polymerization initiators are more preferable, and the oxime compounds are still more preferable in view of the photosensitivity.

From the viewpoint of the resolution, the oxime compound is preferably at least one selected from the group consisting of the following general formulas (19), (20) and (21):

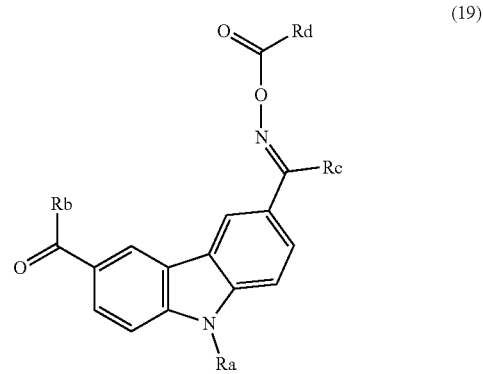

(19)

wherein Ra represents a monovalent organic group having 1 to 10 carbon atoms, Rb represents a monovalent organic group having 1 to 20 carbon atoms, Rc represents a monovalent organic group having 1 to 10 carbon atoms, and Rd represents a monovalent organic group having 1 to 10 carbon atoms;

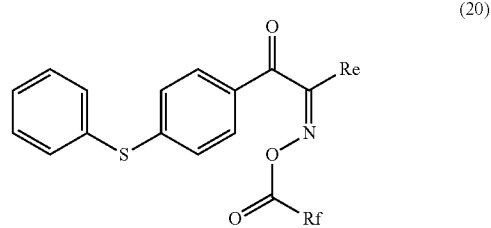

(20)

wherein Re represents a monovalent organic group having 1 to 20 carbon atoms, and Rf represents a monovalent organic group having 1 to 10 carbon atoms; and

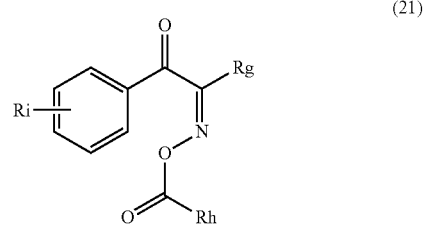

(21)

wherein Rg represents a monovalent organic group having 1 to 20 carbon atoms, Rh represents a monovalent organic group having 1 to 10 carbon atoms, and $R_i$ represents a hydrogen atom or a monovalent organic group having 1 to 10 carbon atoms.

In general formula (19), Ra is not limited as long as it is a monovalent organic group having 1 to 10 carbon atoms, and is preferably an alkyl group having 1 to 5 carbon atoms, and more preferably a methyl group, an ethyl group or a propyl group, from the viewpoint of the heat resistance. Rb is not limited as long as it is an organic group having 1 to 20 carbon atoms, and is preferably an aromatic group having 6 to 20 carbon atoms, or a monovalent organic group derived from a heterocyclic ring compound having 5 to 20 carbon atoms, from the viewpoint of the resolution. Rc is not limited as long as it is an organic group having 1 to 10 carbon atoms. Of these, a monovalent organic group having a saturated alicyclic structure having 3 to 10 carbon atoms is more preferable from the viewpoint of the resolution. Rd is not limited as long as it is an organic group having 1 to 10 carbon atoms. Of these, an organic group having 1 to 3 carbon atoms is preferable, and a methyl group, an ethyl group or a propyl group is more preferable, from the viewpoint of the resolution.

In general formula (20), Re is not limited as long as it is an organic group having 1 to 20 carbon atoms, and is preferably an organic group having 5 to 20 carbon atoms, and more preferably an organic group having 6 to 15 carbon atoms, from the viewpoint of the resolution. Rf is not limited as long as it is an organic group having 1 to 10 carbon atoms, and is preferably an organic group having 1 to 3 carbon atoms, and more preferably a methyl group, an ethyl group or a propyl group, from the viewpoint of the resolution.

In general formula (21), Rg is not limited as long as it is a monovalent organic group having 1 to 10 carbon atoms, and is preferably an alkyl group having 1 to 5 carbon atoms, and more preferably a methyl group, an ethyl group or a propyl group, from the viewpoint of the heat resistance. Rh is not limited as long as it is a monovalent organic group having 1 to 10 carbon atoms, and is preferably a monovalent organic group having 2 to 9 carbon atoms, and more preferably a monovalent organic group having 2 to 8 carbon atoms, from the viewpoint of the resolution. $R_i$ is not limited as long as it is a hydrogen atom or a monovalent organic group having 1 to 10 carbon atoms, and is preferably a hydrogen atom or a monovalent organic group having 1 to 9 carbon atoms from the viewpoint of the resolution.

Of general formulas (19) to (21), the structure represented by general formula (19) or (20) is more preferable from the viewpoint of the resolution.

The amount of the photopolymerization initiator (B) mixed is preferably 0.1 parts by weight or more to 20 parts by weight, and more preferably 1 part by weight or more to 8 parts by weight or less, based on 100 parts by weight of the polyimide precursor (A), or based on 100 parts by weight of the total of the polyimide precursor (A) and the polyimide precursor (A') when the polyimide precursor (A') is contained. The mixing amount thereof is 0.1 parts by weight or more from the viewpoint of light sensitivity or patternability, and preferably 20 parts by weight or less from the viewpoint of the physical properties of the photosensitive resin layer after curing of the negative photosensitive resin composition.

(C) Photopolymerizable Monomer

The negative photosensitive resin composition may comprise a photopolymerizable monomer for improving the resolution of the relief pattern. The photopolymerizable monomer refers to a monomer having a photopolymerizable unsaturated bond. Such a monomer is preferably a (meth) acrylic compound which undergoes a radical polymerization reaction with a photopolymerization initiator, and examples thereof include, but are not particularly limited to, compounds, for example, monoacrylates, diacrylates, monomethacrylates and dimethacrylates of ethylene glycol; monoacrylates, diacrylates, monomethacrylates and dimethacrylates of polyethylene glycol; monoacrylates, diacrylates, monomethacrylates and dimethacrylates of propylene glycol; monoacrylates, diacrylates, monomethacrylates and dimethacrylates of polypropylene glycol; monoacrylates, diacrylates, triacrylates, monomethacrylates, dimethacrylates and trimethacrylates of glycerol; diacrylates and dimethacrylates of cyclohexane; diacrylates and dimethacrylates of 1,4-butanediol; diacrylates and dimethacrylates of 1,6-hexanediol; diacrylates and dimethacrylates of neopentyl glycol; monoacrylates, diacrylates, monomethacrylates and dimethacrylates of bisphenol A; benzene trimethacrylate; isobornyl acrylate and isobornyl methacrylate; acrylamide and derivatives thereof; methacrylamide and derivatives thereof; trimethylolpropane triacrylate and trimethylolpropane trimethacrylate; diacrylates, triacrylates, tetraacrylates, dimethacrylates, trimethacrylates and tetramethacrylates of pentaerythritol; and ethylene oxide adducts or propylene oxide adducts of these compounds.

When the photosensitive resin composition comprises the photopolymerizable unsaturated monomer for improving the resolution of the relief pattern, the amount of the photopolymerizable unsaturated monomer mixed is preferably 1 to 50 parts by weight based on 100 parts by weight of the polyimide precursor (A), or based on 100 parts by weight of the total of the polyimide precursor (A) and the polyimide precursor (A') when the polyimide precursor (A') is contained.

(D) Rust Inhibitor

When a cured film is formed on a substrate made of copper or a copper alloy using a photosensitive resin composition, the negative photosensitive resin composition may optionally comprise a rust inhibitor in order to suppress discoloration on copper. Examples of the rust inhibitor include azole compounds and purine compounds.

Examples of the azole compound include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl) triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(α,α-dimethylbenzyl)phenyl]-benzotriazole, 2-(3,5-di-t-butyl hydroxyphenyl)benzotriazole, 2-(3-t-butyl-5-methyl-2-hydroxyphenyl)-benzotriazole, 2-(3,5-di-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole and 1-methyl-1H-tetrazole.

Particularly preferred examples of the azole compound include tolyltriazole, 5-methyl-1H-benzotriazole and 4-methyl-1H-benzotriazole. These azole compounds may be used alone, or as a mixture of two or more thereof.

Specific examples of the purine compounds include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanineoxime, N-(2-hydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenine, 5-azaadenine, 8-azaadenine, 8-azaguanine, 8-azapurine, 8-azaxanthine, and 8-azahypoxanthine, and derivatives thereof.

When the photosensitive resin composition comprises the rust inhibitor (D), the amount of the rust inhibitor mixed is preferably 0.01 to 20 parts by weight based on 100 parts by weight of the polyimide precursor (A), or based on 100 parts by weight of the total of the polyimide precursor (A) and the polyimide precursor (A') when the polyimide precursor (A') is contained, and is more preferably 0.03 to 10 parts by weight, still more preferably 0.05 to 5 parts by weight, for example, 0.01 to 5 parts by weight, from the viewpoint of the photosensitive properties. When the amount of the rust inhibitor (D) mixed is 0.01 parts by weight or more, discoloration of the surface of copper or a copper alloy is suppressed when the photosensitive resin composition is formed on the copper or the copper alloy, and when the amount is 20 parts by weight or less, excellent photosensitivity is exhibited.

(E) Compound having Urethane Bond or Urea Bond

The photosensitive resin composition may further comprise a compound having a urethane bond or a urea bond. The compound (E) has, in the molecular structure, at least one selected from the group consisting of a urethane bond and a urea bond (hereinafter also referred to as "urethane/urea compound"). The inclusion of the compound (E) improves the adhesion of the photosensitive resin composition to the mold resin and/or the in-plane uniformity when formed as a multilayer. However, such an effect is exhibited by using a solvent together with the urethane/urea compound.

The compound (E) may have a urethane bond and/or a urea bond in the molecular structure. Of these, the compound (E) preferably has a urea bond from the viewpoint of the suppression of Cu surface voids or the chemical resistance.

Of the compounds having a urea bond, from the viewpoint of the developability, a compound represented by the following general formula (17) or (18) is more preferable:

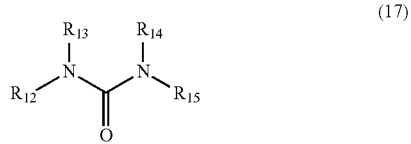

(17)

wherein $R_{12}$ and $R_{15}$ are each independently a monovalent organic group having 1 to 20 carbon atoms which may have a heteroatom, and $R_{13}$ and $R_{14}$ are each independently a hydrogen atom or a monovalent organic group having 1 to 20 carbon atoms which may have a heteroatom; and

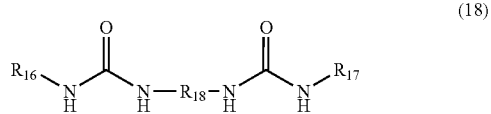

(18)

wherein $R_{16}$ and $R_{17}$ are each independently a monovalent organic group having 1 to 20 carbon atoms which may have a heteroatom, and $R_{18}$ is a divalent organic group having 1 to 20 carbon atoms which may have a heteroatom.

Examples of the heteroatom include an oxygen atom, a nitrogen atom, a phosphorus atom and a sulfur atom. In formula (17), $R_{12}$ and $R_{15}$ may be each independently a monovalent organic group having 1 to 20 carbon atoms which may have a heteroatom, and more preferably have an oxygen atom from the viewpoint of the developability. The number of carbon atoms of $R_{12}$ and $R_{15}$ may be 1 to 20, preferably 1 to 10, and more preferably 3 to 10, from the viewpoint of the heat resistance.

In formula (17), $R_{13}$ and $R_{14}$ may be independently a hydrogen atom or a monovalent organic group having 1 to 20 carbon atoms which may have a heteroatom, and more preferably have a hydrogen atom or an oxygen atom from the viewpoint of the developability. The number of carbon atoms of $R_{13}$ and $R_{14}$ may be 1 to 20, preferably 1 to 10, and more preferably 3 to 10, from the viewpoint of the heat resistance.

In formula (18), $R_{16}$ and $R_{17}$ may be each independently a monovalent organic group having 1 to 20 carbon atoms which may have a heteroatom, and more preferably have an oxygen atom from the viewpoint of the developability. The number of carbon atoms of $R_{16}$ and $R_{17}$ may be 1 to 20, preferably 1 to 10, and more preferably 3 to 10, from the viewpoint of the heat resistance. In formula (18), $R_{18}$ may be a divalent organic group having 1 to 20 carbon atoms which may have a heteroatom, and more preferably have at least one oxygen atom from the viewpoint of the suppression of crack generation or the elongation in a reliability test. The number of carbon atoms of $R_{18}$ may be 1 to 20, preferably 2 or more from the viewpoint of having a heteroatom, and more preferably 1 to 18 from the viewpoint of the heat resistance.

Preferably, the compound (E) further has at least one functional group selected from the group consisting of a (meth)acrylic group, a hydroxyl group and an amino group, and more preferably a (meth)acrylic group.

The photosensitive resin composition comprises the compound (E) together with the solvent, whereby it is possible to improve the adhesion to the mold resin or the in-plane uniformity when formed as a multilayer. Although the reason is not clear, the present inventors think as follows. That is, in one embodiment, since the negative photosensitive resin composition is heat-cured at a low temperature of 180° C. or lower, the polyimide precursor tends to be insufficiently converted into a polyimide. Meanwhile, the photosensitive resin composition comprises the urethane/urea compound (E), whereby a part of the compound (E) is thermally decomposed to generate an amine, which promotes the conversion of the polyimide precursor into a polyimide. In a preferred embodiment, the compound (E) further has a (meth)acrylic group, whereby the compound (E) reacts with a side chain moiety of the polyimide precursor due to light irradiation particularly when a negative photosensitive resin composition is produced, leading to crosslinking, so that the compound is more likely to exist in the vicinity of the polyimide precursor, thus enabling dramatic enhancement in conversion efficiency. Therefore, in the production of polyimide or the production of a cured relief pattern, the conversion into a polyimide is almost completed despite the heat-curing at a low temperature, so that the cyclization reaction does not proceed, leading to no generation of shrinkage stress, thus making it possible to maintain a state of high adhesion. Since the conversion into a polyimide is almost completed, when the photosensitive resin composition is coated and prebaked to form a second layer onto the polyimide film as a first layer, in-plane uniformity is sufficiently exhibited because the first layer has sufficient solvent resistance.

When the compound (E) further has a (meth)acrylic group, the (meth)acrylic equivalent of the compound (E) is preferably 150 to 400 g/mol. When the (meth)acrylic equivalent of the compound (E) is 150 g/mol or more, the negative photosensitive resin composition tends to exhibit satisfactory chemical resistance, and when it is 400 g/mol or less, the negative photosensitive resin composition tends to exhibit satisfactory developability. The lower limit of the (meth)acrylic equivalent of the compound (E) is more preferably 200 g/mol or more, 210 g/mol or more, 220 g/mol or more, or 230 g/mol or more, still more preferably 240 g/mol or more, or 250 g/mol or more. The lower limit is more preferably 350 g/mol or less, or 330 g/mol or less, and still more preferably 300 g/mol or less. The (meth)acrylic equivalent of the compound (E) is yet more preferably 210 to 400 g/mol, and particularly preferably 220 to 400 g/mol.

The urethane/urea compound (E) is preferably a urethane/urea compound having a (meth)acrylic group and having a structure represented by the following general formula (e1):

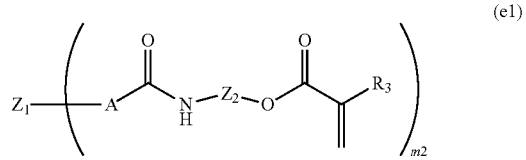

(e1)

wherein $R_3$ is a hydrogen atom or a methyl group, A is one group selected from the group consisting of —O—, —NH— and —NL$_4$-, L$_4$ is a monovalent organic group having 1 to 12 carbon atoms, $Z_1$ is an $m_2$-valent organic group having 2 to 24 carbon atoms, $Z_2$ is a divalent organic group having 2 to 8 carbon atoms, and $m_2$ is an integer of 1 to 3.

In formula (e1), $R_3$ may be a hydrogen atom or a methyl group, and a methyl group is preferable from the viewpoint of the developability. $Z_1$ may be an $m_2$-valent organic group having 2 to 24 carbon atoms, and preferably has 2 to 20 carbon atoms. Here, $Z_1$ can also have a heteroatom such as an oxygen atom, a sulfur atom, a nitrogen atom or a phosphorus atom. When the number of carbon atoms of $Z_1$ is 2 or more, the negative photosensitive resin composition tends to exhibit satisfactory chemical resistance, and when the number of carbon atoms is 20 or less, the negative photosensitive resin composition tends to exhibit satisfactory developability. The number of carbon atoms of $Z_1$ is more preferably 3 or more, and still more preferably 4 or more, and is more preferably 18 or less, and still more preferably 16 or less. $Z_2$ may be a divalent organic group having 2 to 8 carbon atoms. Here, $Z_2$ can also have a heteroatom such as an oxygen atom, a sulfur atom, a nitrogen atom or a phosphorus atom. When the number of carbon atoms of $Z_2$ is 2 or more, the negative photosensitive resin composition tends to exhibit satisfactory chemical resistance, and when the number of carbon atoms is 8 or less, the negative photosensitive resin composition tends to exhibit satisfactory heat resistance. The number of carbon atoms of $Z_2$ is preferably 6 or less, and more preferably 4 or less. A is one group selected from the group consisting of —O—, —NH— and NL$_4$-, wherein L$_4$ is a monovalent organic group having 1 to 12 carbon atoms. From the viewpoint of the chemical resistance, A is preferably —NH— or NL$_4$-.

The (meth)acrylic group-containing urea/urethane compound of general formula (e1) can be obtained, for example, by reacting an isocyanate compound represented by the following general formula with an amine and/or a hydroxyl group-containing compound:

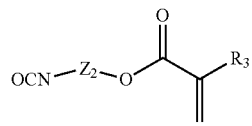

Of the compounds (E) described above, at least one compound selected from the group consisting of the following formulas (e2) to (e11) is particularly preferable from the viewpoints of the chemical resistance, void suppression, and developability:

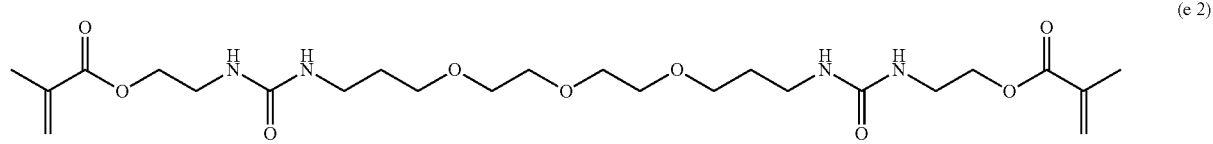

(e 2)

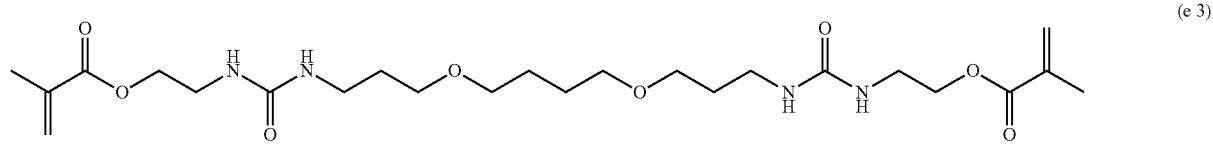

(e 3)

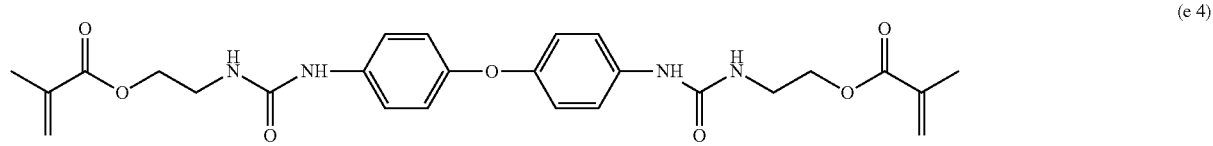

(e 4)

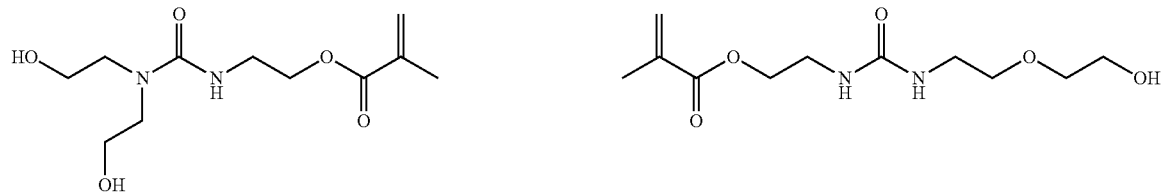

(e 5)                    (e 6)

-continued

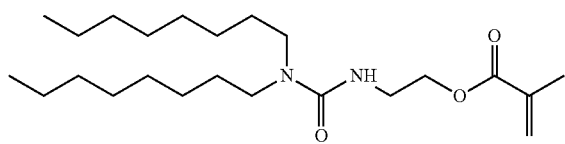
(e 7)

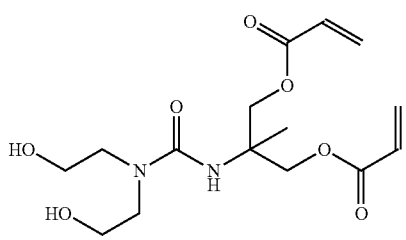
(e 8)

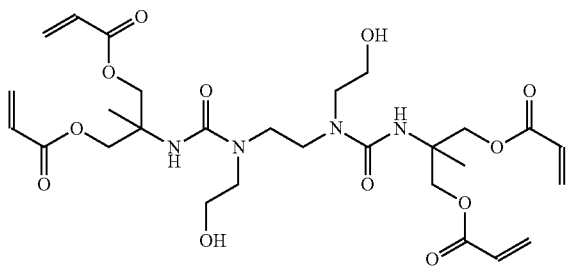
(e 9)

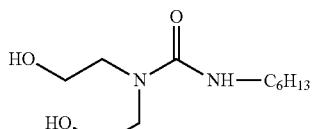
(e 10)

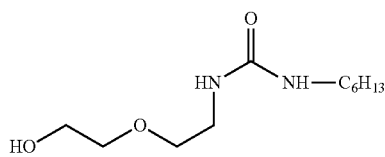
(e 11)

In another embodiment, tetramethylurea can be used as the compound having a urea bond (E).

The compound (E) may be used alone, or two or more thereof may be mixed and used. The amount of the compound (E) mixed is preferably 0.1 parts by weight or more to 30 parts by weight or less, and more preferably 1 part by weight or more to 20 parts by weight or less, based on 100 parts by weight of the polyimide precursor (A), or based on 100 parts by weight of the total of the polyimide precursor (A) and the polyimide precursor (A') when the polyimide precursor (A') is contained. The amount of the compound (E) mixed is 0.1 parts by weight or more from the viewpoint of the photosensitivity or patternability, and 30 parts by weight or less from the viewpoint of the physical properties of the photosensitive resin layer after curing of the negative photosensitive resin composition.

The negative photosensitive resin composition may comprise components other than the components (A) to (E) mentioned above. Examples of the components other than the components (A) to (E) include, but are not limited to, a solvent, a nitrogen-containing heterocyclic compound, a hindered phenol compound, an organic titanium compound, an adhesive aid, a sensitizer, a thermal polymerization inhibitor and a thermal base generator.

Solvent

Examples of the solvent include amides, sulfoxides, urea and derivatives thereof, ketones, esters, lactones, ethers, halogenated hydrocarbons, hydrocarbons and alcohols. Specifically, it is possible to use N-methyl-2-pyrrolidone, N,N-dimethylacetamide, N,N-dimethylformamide, dimethyl sulfoxide, tetramethylurea, acetone, methyl ethyl ketone, methyl isobutyl ketone, cyclopentanone, cyclohexanone, methyl acetate, ethyl acetate, butyl acetate, diethyl oxalate, ethyl lactate, methyl lactate, butyl lactate, γ-butyrolactone, propylene glycol monomethyl ether acetate, propylene glycol monomethyl ether, benzyl alcohol, phenyl glycol, tetrahydrofurfuryl alcohol, ethylene glycol dimethyl ether, diethylene glycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene and mesitylene. Of these, from the viewpoints of the solubility of the resin, stability of the resin composition and adhesion to the substrate, one or more selected from the group consisting of N-methyl-2-pyrrolidone, dimethyl sulfoxide, tetramethylurea, butyl acetate, ethyl lactate, γ-butyrolactone, propylene glycol monomethyl ether acetate, propylene glycol monomethyl ether, diethylene glycol dimethyl ether, benzyl alcohol, phenyl glycol and tetrahydrofurfuryl alcohol are preferable.

Of these solvents, solvents which completely dissolve the polyimide precursor are preferable and, for example, N-methyl-2-pyrrolidone, N,N-dimethylacetamide, N,N-dimethylformamide, dimethyl sulfoxide, tetramethylurea and gamma butyrolactone are suitable.

The amount of the solvent used in the photosensitive resin composition is preferably in the range of 100 to 1,000 parts by weight, more preferably 120 to 700 parts by weight, and still more preferably 125 to 500 parts by weight, based on 100 parts by weight of the polyimide precursor (A), or based on 100 parts by weight of the total of the polyimide precursor (A) and the polyimide precursor (A') when the polyimide precursor (A') is contained.

Hindered Phenol Compound

In order to suppress discoloration on the copper surface, the negative photosensitive resin composition may optionally comprise a hindered phenol compound. Examples of the hindered phenol compound include, but are not limited to, 2,6-di-t-butyl-4-methylphenol, 2,5-di-t-butyl-hydroquinone, octadecyl-3-(3,5-di-t-butyl-4-hydroxyphenyl)propionate, isooctyl-3-(3,5-di-t-butyl-4-hydroxyphenyl)propionate, 4,4'-methylenebis(2,6-di-t-butylphenol), 4,4'-thio-bis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thio-diethylenebis[3-(3,5-di-t-butyl-4-hydroxyphenyl)propionate], N,N'-hexamethylenebis(3,5-di-t-butyl-4-hydroxy-hydrocinnamide), 2,2'-methylene-bis(4-methyl-6-t-butylphenol), 2,2'-methylene-bis(4-ethyl-6-t-butylphenol), pentaerythrityl-tetrakis[3-(3,5-di-t-butyl-4-hydroxyphenyl) propionate], tris-(3,5-di-t-butyl-4-hydroxybenzyl)-isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H, 5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione and 1,3,5-tris(4-t-butyl-5-ethyl-3-hydroxy-2-methylbenzyl)-1,3,5-triazine-2,4,6-(1H,3H,5H)-trione. Of these, 1,3,5-tris(4-t-butyl-3-hydroxy-2,6-dimethylbenzyl)-1,3,5-triazine-2,4,6-(1H,3H,5H)-trione is particularly preferable.

The amount of the hindered phenol compound mixed is preferably 0.1 to 20 parts by weight, and more preferably 0.5 to 10 parts by weight, based on 100 parts by weight of the polyimide precursor (A), or based on 100 parts by weight of the total of the polyimide precursor (A) and the polyimide precursor (A') when the polyimide precursor (A') is contained, from the viewpoint of the photosensitive properties. When the amount of the hindered phenol compound mixed is 0.1 parts by weight or more, for example, when the photosensitive resin composition of the present disclosure is formed on copper or a copper alloy, discoloration and corrosion of the copper or the copper alloy are prevented, while when the amount is 20 parts by weight or less, the photosensitivity is excellent.

Organic Titanium Compound

The negative photosensitive resin composition may comprise an organic titanium compound. The inclusion of the organic titanium compound enables the negative photosensitive resin composition to form a photosensitive resin layer excellent in chemical resistance even when cured at a low temperature.

Examples of the usable organic titanium compound include those in which an organic group is bonded to a titanium atom via a covalent bond or an ionic bond.

Specific examples of the organic titanium compound are shown in I) to VII) below:

I) Titanium chelate compounds: Of these, titanium chelates having two or more alkoxy groups are more preferable since the negative photosensitive resin composition has satisfactory storage stability and a satisfactory curing pattern can be obtained. Specific examples thereof include titanium bis(triethanolamine) diisopropoxide, titanium di(n-butoxide)bis(2,4-pentanedionate), titanium diisopropoxide bis(2,4-pentanedionate), titanium diisopropoxide bis(tetramethyl-heptanedionate) and titanium diisopropoxide bis (ethylacetate).

II) Tetraalkoxy titanium compounds: for example, titanium tetra(n-butoxide), titanium tetraethoxide, titanium tetra (2-ethylhexoxide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), titanium tetrastearyloxide and titanium tetrakis[bis{2,2-(allyloxymethyl)butoxide}].

III) Titanocene compounds: for example, pentamethylcyclopentadienyl titanium trimethoxide, bis($\eta^5$-2,4-cyclopentadien-1-yl)bis(2,6-difluorophenyl)titanium and bis($\eta^5$-2,4-cyclopentadien-1-yl)bis(2,6-difluoro-3-(1H-pyrrol-1-yl) phenyl)titanium.

IV) Monoalkoxytitanium compounds: for example, titanium tris(dioctylphosphate) isopropoxide and titanium tris (dodecylbenzenesulfonate) isopropoxide.

V) Titanium oxide compounds: for example, titanium oxide bis(pentanedionate), titanium oxide bis(tetramethyl-heptanedionate) and phthalocyanine titanium oxide.

VI) Titanium tetraacetylacetonate compounds: for example, titanium tetraacetylacetonate.

VII) Titanate coupling agents: for example, isopropyltri-dodecylbenzenesulfonyl titanate.

Of these, the organic titanium compound is preferably at least one compound selected from the group consisting of I) titanium chelate compounds, II) tetraalkoxy titanium compounds and III) titanocene compounds mentioned above, from the viewpoint of exhibiting more satisfactory chemical resistance. In particular, titanium diisopropoxide bis(ethyl-acetoacetate), titanium tetra(n-butoxide) and bis($\eta^5$-2,4-cyclopentadien-1-yl)bis(2,6-difluoro-3-(1H-pyrrol-1-yl)phenyl)titanium are preferable.

When the organic titanium compound is mixed, the mixing amount thereof is preferably 0.05 to 10 parts by weight, and more preferably 0.1 to 2 parts by weight, based on 100 parts by weight of the polyimide precursor (A), or based on 100 parts by weight of the total of the polyimide precursor (A) and the polyimide precursor (A') when the polyimide precursor (A') is contained. When the mixing amount thereof is 0.05 parts by weight or more, satisfactory heat resistance and chemical resistance are exhibited in the obtained curing pattern, while when it is 10 parts by weight or less, the photosensitive resin composition is excellent in storage stability.

Adhesive Aid

The negative photosensitive resin composition may optionally comprise an adhesive aid in order to improve the adhesion between the film formed by using the negative photosensitive resin composition and a substrate. It is possible to use, as the adhesive aid, an aluminum-based adhesive aid or a silane coupling agent.

Examples of the aluminum-based adhesive aid include aluminum tris(ethylacetoacetate), aluminum tris(acetylacetonate) and ethylacetoacetate aluminum diisopropylate.

Examples of the silane coupling agent include, but are not limited to, γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, trimethoxyphenylsilane, trimethoxy(p-tolyl)silane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamic acid, benzophenone-3,3'-bis (N-[3-triethoxysilyl]propylamide)-4,4'-dicarboxylic acid, benzene-1,4-bis(N-[3-triethoxysilyl]propylamide)-2,5-dicarboxylic acid, 3-(triethoxysilyl)propylsuccinic anhydride, N-phenylaminopropyltrimethoxysilane, 3-ureidopropyltrimethoxysilane, 3-ureidopropyltriethoxysilane, 3-(trialkoxysilyl)propylsuccinic anhydride, 3-mercaptopropyltrimethoxysilane (manufactured by Shin-Etsu Chemical Co., Ltd.: trade name of KBM803, manufactured by CHISSO CORPORATION: trade name of Sila-Ace S810), 3-mercaptopropyltriethoxysilane (manufactured by Azmax Corporation: trade name of SIM6475.0), 3-mercaptopropylmethyldimethoxysilane (manufactured by Shin-Etsu Chemical Co., Ltd.: trade name of LS1375, manufactured by Azmax Corporation: trade name of SIM6474.0), mercaptomethyltrimethoxysilane (manufactured by Azmax Corporation: trade name of SIM6473.5C), mercaptomethylmethyldimethoxysilane (manufactured by Azmax Corporation: trade name of SIM6473.0), 3-mercaptopropyldiethoxymethoxysilane, 3-mercaptopropylethoxydimethoxysilane, 3-mercaptopropyltripropoxysilane, 3-mercaptopropyldiethoxypropoxysilane, 3-mercaptopropylethoxydipropoxysilane, 3-mercaptopropyldimethoxypropoxysilane, 3-mercaptopropylmethoxydipropoxysilane, 2-mercaptoethyltrimethoxysilane, 2-mercaptoethyldiethoxymethoxysilane, 2-mercaptoethylethoxydimethoxysilane, 2-mercaptoethyltripropoxysilane, 2-mercaptoethyltripropoxysilane, 2-mercaptoethylethoxydipropoxysilane, 2-mercaptoethyldimethoxypropoxysilane, 2-mercaptoethylmethoxydipropoxysilane, 4-mercaptobutyltrimethoxysilane, 4-mercaptobutyltriethoxysilane, 4-mercaptobutyltripropoxysilane, N-(3-triethoxysilylpropyl)urea (manufactured by Shin-Etsu Chemical Co., Ltd.: trade name of LS3610, manufactured by Azmax Corporation: trade name of SIU9055.0), N-(3-trimethoxysilylpropyl)urea (manufactured by Azmax Corporation: trade name of SIU9058.0), N-(3-diethoxymethoxysilylpropyl)urea, N-(3-ethoxydimethoxysilylpropyl)urea, N-(3-tripropoxysilylpropyl)urea, N-(3-diethoxypropoxysilylpropyl)urea, N-(3-ethoxydipropoxysilylpropyl)urea, N-(3-dimethoxypropoxysilylpropyl)urea, N-(3-methoxydipropoxysilylpropyl)urea, N-(3-trimethoxysilylethyl)urea, N-(3-ethoxydimethoxysilylethyl)urea, N-(3-tripropoxysilylethyl)urea, N-(3-tripropoxysilylethyl)urea, N-(3-ethoxydipropoxysilylethyl)urea, N-(3-dimethoxypropoxysilylethyl)urea, N-(3-methoxydipropoxysilylethyl)urea, N-(3-trimethoxysilylbutyl)urea, N-(3-triethoxysilylbutyl)urea, N-(3-tripropoxysilylbutyl)urea, 3-(m-aminophenoxy)propyltrimethoxysilane (manufactured by Azmax Corporation: trade name of SLA0598.0), m-aminophenyltrimethoxysilane (manufactured by Azmax Corporation: trade name of SLA0599.0), p-aminophenyltrimethoxysilane (manufactured by Azmax Corporation: trade name of SLA0599.1) aminophenyltrimethoxysilane (manufactured by Azmax Corporation: trade name of SLA0599.2), 2-(trimethoxysilylethyl)pyridine (manufactured by Azmax Corporation: trade name of SIT8396.0), 2-(triethoxysilylethyl)pyridine, 2-(dimethoxysilylmethylethyl)pyridine, 2-(diethoxysilylmethylethyl)pyridine, (3-triethoxysilylpropyl)-t-butyl carbamate, (3-glycidoxypropyl)triethoxysilane, tetramethoxysilane, tetraethoxysilane, tetra-n-propoxysilane, tetra-i-propoxysilane, tetra-n-butoxysilane, tetra-i-butoxysilane, tetra-t-butoxysilane, tetrakis(methoxyethoxysilane), tetrakis(methoxy-n-propoxysilane), tetrakis(ethoxyethoxysilane), tetrakis(methoxyethoxyethoxysilane), bis(trimethoxysilyl)ethane, bis(trimethoxysilyl)hexane, bis(triethoxysilyl)methane, bis (triethoxysilyl)ethane, bis(triethoxysilyl)ethylene, bis(triethoxysilyl)octane, bis(triethoxysilyl)octadiene, bis[3-(triethoxysilyl)propyl]disulfide, bis[3-(triethoxysilyl)propyl]tetrasulfide, di-t-butoxydiacetoxysilane, di-i-butoxyaluminoxytriethoxysilane, phenylsilanetriol, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, dimethoxydiphenylsilane, diethoxydiphenylsilane, dimethoxydi-p-tolylsilane, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyl diphenylsilanol, isopropyldiphenylsilanol, n-butyldiphenylsilanol, isobutyldiphenylsilanol, tert-butyldiphenylsilanol and triphenylsilanol, and silane coupling agents each represented by the following formula (S-1):

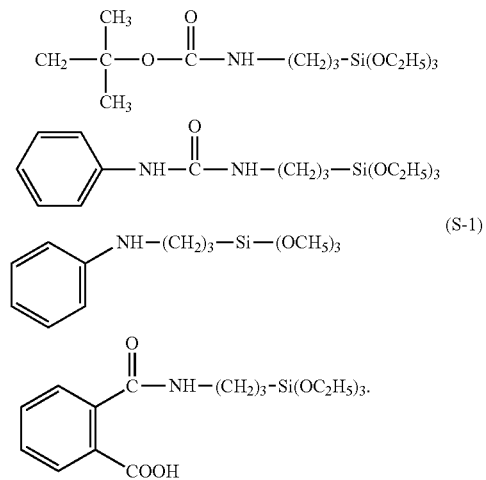

Of these adhesive aids, the silane coupling agent is more preferably used in view of the adhesive force. Of the silane coupling agents mentioned above, it is preferable to use one or more selected from the group consisting of phenylsilanetriol, trimethoxyphenylsilane, trimethoxy(p-tolyl)silane, diphenylsilanediol, dimethoxydiphenylsilane, diethoxydiphenylsilane, dimethoxydi-p-tolylsilane, triphenylsilanol, and silane coupling agents each represented by the formula (S-1).

When the photosensitive resin composition comprises the adhesive aid, the amount of the adhesive aid mixed is preferably in the range of 0.01 to 25 parts by weight, and more preferably 0.5 to 20 parts by weight, based on 100 parts by weight of the polyimide precursor (A), or based on 100 parts by weight of the total of the polyimide precursor (A) and the polyimide precursor (A') when the polyimide precursor (A') is contained. When the silane coupling agent is used, the mixing amount thereof is preferably 0.01 to 20 parts by weight based on 100 parts by weight of the polyimide precursor (A), or based on 100 parts by weight of the total of the polyimide precursor (A) and the polyimide precursor (A') when the polyimide precursor (A') is contained.

Sensitizer

The negative photosensitive resin composition may optionally comprise a sensitizer in order to improve the photosensitivity. Examples of the sensitizer include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino) chalcone, 4,4'-bis(diethylamino)chalcone, p-dimethylaminocinnamilideneindanone, p-dimethylaminobenzylideneindanone, 2-(p-dimethylaminophenylbiphenylene)-benzothiazole, 2-(p-dimethylaminophenylvinylene) benzothiazole, 2-(p-dimethylaminophenylvinylene) isonaphthothiazole, 1,3-bis(4'-dimethylaminobenzal) acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzthiazole, 2-(p-dimethylaminostyryl)naphtho(1,2-d)thiazole and 2-(p-dimethylaminobenzoyl)styrene. These can be used alone, or in combination of two to five thereof.

When the photosensitive resin composition comprises a sensitizer for improving the photosensitivity, the mixing amount thereof is preferably 0.1 to 25 parts by weight based on 100 parts by weight of the polyimide precursor (A), or based on 100 parts by weight of the total of the polyimide precursor (A) and the polyimide precursor (A') when the polyimide precursor (A') is contained.

Thermal Polymerization Inhibitor

The negative photosensitive resin composition may optionally comprise a thermal polymerization inhibitor in order to improve the stability of the viscosity and photosensitivity during storage, particularly in a solution containing a solvent. It is possible to use, as the thermal polymerization inhibitor, for example, hydroquinone, N-nitrosodiphenylamine, p-tert-butylcatechol, phenothiazine, N-phenylnaphthylamine, ethylenediaminetetraacetic acid, 1,2-cyclohexanediaminetetraacetic acid, glycol ether diaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamineammonium salt and N-nitroso-N(1-naphthyl)hydroxylamineammonium salt.

Thermal Base Generator

The negative photosensitive resin composition may comprise a thermal base generator. The base generator refers to a compound which generates a base by heating. The inclusion of the thermal base generator further promotes the imidization of the photosensitive resin composition.

Examples of the thermal base generator include, but are not limited to, an amine compound protected with a tert-butoxycarbonyl group and a thermal base generator disclosed in WO 2017/038598. However, the thermal base generator is not limited thereto, and other known thermal base generators can be used.

Examples of the amine compound protected with the tert-butoxycarbonyl group include, but are not limited to, ethanolamine, 3-amino-1-propanol, 1-amino-2-propanol, 2-amino-1-propanol, 4-amino-1-butanol, 2-amino-1-butanol, 1-amino-2-butanol, 3-amino-2,2-dimethyl-1-propanol, 4-amino-2-methyl-1-butanol, valinol, 3-amino-1,2-propanediol, 2-amino-1,3-propanediol, tyramine, norephedrine, 2-amino-1-phenyl-1,3-propanediol, 2-aminocyclohexanol, 4-aminocyclohexanol, 4-aminocyclohexaneethanol, 4-(2-aminoethyl)cyclohexanol, N-methylethanolamine, 3-(methylamino)-1-propanol, 3-(isopropylamino)propanol, N-cyclohexylethanolamine, α-[2-(methylamino)ethyl]benzyl alcohol, diethanolamine, diisopropanolamine, 3-pyrrolidinol, 2-pyrrolidinemethanol, 4-hydroxypiperidine, 3-hydroxypiperidine, 4-hydroxy-4-phenylpiperidine, 4-(3-hydroxyphenyl)piperidine, 4-piperidinemethanol, 3-piperidinemethanol, 2-piperidinemethanol, 4-piperidineethanol, 2-piperidineethanol, 2-(4-piperidyl)-2-propanol, 1,4-butanolbis(3-aminopropyl)ether, 1,2-bis(2-aminoethoxy)ethane, 2,2'-oxybis(ethylamine), 1,14-diamino-3,6,9,12-tetraoxatetradecane, 1-aza-15-crown 5-ether, diethylene glycol bis(3-aminopropyl)ether, 1,11-diamino-3,6,9-trioxaundecane and diethylene glycol bis(3-aminopropyl)ether, and compounds in which an amino group of an amino acid and derivatives thereof is protected with a tert-butoxycarbonyl group.

The amount of the thermal base generator mixed is preferably 0.1 parts by weight or more to 30 parts by weight or less, more preferably 0.5 parts by weight or more to 15 parts by weight or less, still more preferably 1 part by weight or more to 20 parts by weight or less, for example, 0.5 parts by weight or more to 20 parts by weight or less, based on 100 parts by weight of the polyimide precursor (A), or based on 100 parts by weight of the total of the polyimide precursor (A) and the polyimide precursor (A') when the polyimide precursor (A') is contained. The mixing amount thereof is 0.1 parts by weight or more from the viewpoint of the imidization promoting effect, and preferably 20 parts by weight or less from the viewpoint of the physical properties of the photosensitive resin layer after curing of the negative photosensitive resin composition.

<Method for Producing Cured Relief Pattern>

The method for producing a cured relief pattern of the present disclosure comprises:

(1) a step of applying the above-mentioned negative photosensitive resin composition of the present disclosure onto a substrate to form a photosensitive resin layer on the substrate (resin layer formation step), (2) a step of exposing the photosensitive resin layer (exposure step), (3) a step of developing the exposed photosensitive resin layer to form a relief pattern (relief pattern formation step), and (4) a step of subjecting the relief pattern to a heat treatment to form a cured relief pattern (cured relief pattern formation step).

(1) Resin Layer Formation Step

In this step, the negative photosensitive resin composition is applied onto a substrate, and then dried as necessary to form a photosensitive resin layer. It is possible to use, as the application method, methods conventionally used for the application of a photosensitive resin composition, for example, a method of applying using a spin coater, a bar coater, a blade coater, a curtain coater or a screen-printing machine, or a method of spray coating using a spray coater.

As necessary, the coating film containing the photosensitive resin composition can be dried. It is possible to use, as the drying method, a method such as air drying, heat drying using an oven or a hot plate, or vacuum drying. Specifically, when air drying or heat drying is carried out, drying can be carried out under the conditions at 20° C. to 150° C. for 1 minute to 1 hour. In such a manner, the photosensitive resin layer can be formed on the substrate.

(2) Exposure Step

In this step, the photosensitive resin layer formed as mentioned above is exposed through a photomask or a reticle having a pattern or directly, using an exposure device such as a contact aligner, a mirror projection, or a stepper. By this exposure, the polymerizable group of the polyimide precursor ((A) and/or (A')) contained in the negative photosensitive resin composition is crosslinked by the action of the photopolymerization initiator (B). This crosslinking makes the exposed portion insoluble in a developer mentioned later, and thus a relief pattern can be formed.

Thereafter, for the purpose of improving the photosensitivity, post-exposure baking (PEB) and/or pre-development baking according to a combination of an arbitrary temperature and time may be carried out, as necessary. The range of baking conditions is preferably 40° C. to 120° C., and the time is preferably 10 seconds to 240 seconds, though the baking is not limited to these ranges unless the various properties of the photosensitive resin composition of the present invention are inhibited thereby.

(3) Relief Pattern Formation Step

In this step, the unexposed area of the exposed photosensitive resin layer is developed and removed. As the developing method for developing a photosensitive resin layer after exposure (irradiation), any method can be selected and used from conventionally known methods of developing a photoresist, for example, a rotary spray method, a paddle method and an immersion method accompanied by an ultrasonic treatment. After development, for the purpose of adjusting the shape of the relief pattern, post-development baking may be carried out by a combination of an arbitrary temperature and time, as necessary.

As the developer used for development, for example, a good solvent for the negative photosensitive resin composition or a combination of a good solvent and a poor solvent is preferable. As the good solvent, for example, N-methyl-2-pyrrolidone, N-cyclohexyl-2-pyrrolidone, N,N-dimethylacetamide, cyclopentanone, cyclohexanone, γ-butyrolactone and α-acetyl-γ-butyrolactone are preferable. As the poor solvent, for example, toluene, xylene, methanol, ethanol, isopropyl alcohol, ethyl lactate, propylene glycol methyl ether acetate and water are preferable. When a good solvent and a poor solvent are mixed and used, it is preferable to adjust the ratio of the poor solvent to the good solvent in accordance with the solubility of the polymer in the negative photosensitive resin composition. Two or more solvents may be used, for example, a plurality thereof may be used in combination.

(4) Cured Relief Pattern Formation Step

In this step, the relief pattern obtained by the above development is subjected to a heat treatment to dilute the photosensitive component, and the polyimide precursor is imidized to convert it into a cured relief pattern composed of a polyimide. It is possible to select, as the method of a heat treatment, for example, various methods such as those using a hot plate, an oven, and a temperature raising oven capable of setting a temperature program. The heat treatment can be carried out under the conditions, for example, at 150° C. to 350° C. for 30 minutes to 5 hours. The heat treatment is carried out at a temperature of 150° C. to 250° C., preferably 150° C. to 200° C., and more preferably 150° C. to 180° C. Air may be used as an atmosphere gas during heat-curing, and an inert gas such as nitrogen or argon can also be used. The negative photosensitive resin composition can preferably provide a polyimide in which the imidization rate is 60% or more by a heat treatment at 150° C. to 250° C.

The exposed photosensitive resin layer has a crosslinked structure formed by crosslinking the polymerizable groups of the polyimide precursor. However, it is thought that this crosslinked structure is desorbed from the polymer during heating in the cured relief pattern formation step, and the amic acid structure generated by the desorption undergoes ring closure to form an imide ring structure, thus obtaining a cured relief pattern composed of the polyimide.

<Polyimide>

The negative photosensitive resin composition of the present disclosure can be cured to form a polyimide. It is thought that the cured relief pattern formed from the photosensitive resin composition of the present disclosure comprises a polyimide having a structure represented by the following general formula (16):

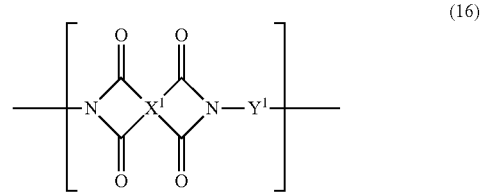

(16)

wherein, in general formula (16), $X^1$ and $Y^1$ are the same as $X^1$ and $Y^1$ in general formula (1), respectively, and preferred $X^1$ and $Y^1$ in general formula (1) are also preferable in the polyimide of general formula (16) for the same reason.

<Semiconductor Device>

In the present disclosure, there is also provided a semiconductor device having a cured relief pattern obtained from the photosensitive resin composition mentioned above. Specifically, there is provided a semiconductor device having a base material which is a semiconductor element, and a cured relief pattern. The cured relief pattern may be produced by the above-mentioned method for producing a cured relief pattern using the above-mentioned photosensitive resin composition.

The present disclosure is also directed to a method for producing a semiconductor device, wherein the method comprises using a semiconductor element as a base material, and the above-mentioned method for producing a cured relief pattern as a part of the method. In this case, the semiconductor device can be produced by forming a cured relief pattern formed by the above-mentioned method for producing a cured relief pattern as a surface protective film of a semiconductor device, an interlayer insulating film, a rewiring insulating film, a protective film for flip-chip devices, or a protective film of a semiconductor device having a bump structure, and combining it with a known method for producing a semiconductor device.

<Display Device>

In the present disclosure, there is provided a display device comprising a display element and a cured film provided on an upper portion of the display element, wherein the cured film is the cured relief pattern mentioned above. Here, the cured relief pattern may be laminated in direct contact with the display element or may be laminated with another layer interposed therebetween. Examples of the cured film include surface protective films, insulating films and flattening films for TFT liquid crystal display elements and color filter elements; protrusions for MVA type liquid crystal display devices; and partition walls for organic EL element cathodes.

In addition to application to semiconductor devices as mentioned above, the negative photosensitive resin composition of the present disclosure is also useful in applications such as interlayer insulation of multilayer circuits, covercoating of flexible copper clad plates, solder resist films, and liquid crystal alignment films.

EXAMPLES

<Measurement and Evaluation Methods>
(1) Weight-Average Molecular Weight

The weight-average molecular weight (Mw) of each resin was measured using the gel permeation chromatography method (standard polystyrene equivalent) under the following conditions.

Pump: JASCO PU-980
Detector: JASCO RI-930
Column Oven: JASCO CO-965, 40° C.
Columns: Serially connected Shodex KD-805/KD-804/KD-803, manufactured by Showa Denko K.K.
Standard Monodisperse Polystyrene: Shodex STANDARD SM-105, manufactured by Showa Denko K.K.
Mobile Phase: 0.1 mol/L LiBr/N-methyl-2-pyrrolidone (NMP)
Flow rate: 1 mL/min (2) Fabrication of Cured Relief Pattern on Cu Ti having a thickness of 200 nm and Cu having a thickness of 400 nm were sputtered in this order onto a 6-inch silicon wafer (manufactured by Fujimi Electronics Industry Co., Ltd., thickness of 625±25 µm) using a sputtering device (Model L-440S-FHL, manufactured by Canon Anelva Corporation). Subsequently, a negative photosensitive resin composition prepared by the method mentioned later was spin-coated on this wafer using a coater developer (model D-Spin 60A, manufactured by SOKUDO Co., Ltd.), and prebaked on a hot plate at 110° C. for 180 seconds to form a coating film having a thickness of about 15 µm. Using a test patterned mask, the coating film was irradiated with energy of 40 to 600 mJ/cm$^2$ by a Prisma GHI (manufactured by Ultratech Inc). The coating was then spray-developed with cyclopentanone as a developer by a coater developer (Model D-Spin 60A, manufactured by SOKUDO Co., Ltd.) in a time calculated by multiplying the time required for the unexposed area to be completely dissolved and disappeared by 1.4, and subjected to rotary spray rinsing with propylene glycol methyl ether acetate for 10 seconds to obtain a relief pattern on Cu. The wafer on which the relief pattern on Cu was formed was subjected to a heat treatment in a nitrogen atmosphere at the curing temperature mentioned in Table 1 for 2 hours, using a temperature programmed curing furnace (Model VF-2000, manufactured by Koyo Lindberg Co., Ltd.) to obtain a cured relief pattern made of a resin having a thickness of about 8 to 10 µm on Cu.

(3) Resolution Evaluation of Cured Relief Pattern on Cu

The cured relief pattern obtained by the above method was observed under an optical microscope to determine the minimum opening pattern size. At this time, if the area of the openings of the obtained pattern was one-half or more of the corresponding pattern mask opening area, it was considered to be resolved, and the length of the mask opening side corresponding to the one having the smallest area among the resolved openings was defined as the resolution. The resolution was evaluated by the following criteria.

Those having the resolution of less than 10 µm were rated as "Excellent".
Those having the resolution of 10 µm or more to less than 12 µm were rated as "Good".
Those having the resolution of 12 µm or more to less than 17 µm were rated as "Fair".
Those having the resolution of 17 µm or more were rated as "Poor".

(4) Measurement of Imidization Rate

The cured relief pattern resin portion was measured by an ATR-FTIR measuring device (Nicolet Continuum, manufactured by Thermo Fisher Scientific) using a Si prism, and the value obtained by dividing the peak intensity at 1380 cm$^{-1}$ by the peak intensity at 1500 cm$^{-1}$ is defined as the imidization index. The imidization rate was calculated by dividing the imidization index of each of the films of the Examples and Comparative Examples cured at the curing temperature shown in Table 1 by the imidization index of the film of the resin composition cured at 350° C. The imidization rate was evaluated by the following criteria.

Those having the imidization rate of 90% or more were rated as "Excellent".
Those having the imidization rate of 75% or more to less than 90% were rated as "Good".
Those having the imidization rate of 40% or more to less than 75% were rated as "Fair".
Those having the imidization rate of less than 40% were rated as "Poor".

(5) Evaluation of Copper Adhesion

In the same manner as in the above-mentioned fabrication of the cured relief pattern, the photosensitive resin composition prepared by the method mentioned later was applied onto a 6-inch silicon wafer sputtered with Ti and Cu in advance and prebaked, followed by subjecting to a heat treatment in a nitrogen atmosphere at the curing temperature mentioned in Table 1 for 2 hours, using a temperature programmed curing furnace (Model VF-2000, manufactured by Koyo Lindberg Co., Ltd.) to obtain a cured film made of a resin having a thickness of about 10 µm on Cu. In accordance with JIS K 5600-5-6 standard cross-cut method, the adhesive properties between the copper substrate and the cured resin coating film of the heat-treated film were evaluated by the following criteria.

Those in which the number of grids of the cured resin coating film adhered to the substrate is 80 or more to 100 were rated as "Excellent".
Those in which the number of grids of the cured resin coating film adhered to the substrate is 40 or more to less than 80 were rated as "Fair".
Those in which the number of grids of the cured resin coating film adhered to the substrate is less than 40 were rated as "Poor".

(6) Measurement of Volatilization Amount

The temperature of each of the urea compounds synthesized in the Examples was raised from 25° C. to 170° C. at 5° C./min in a nitrogen atmosphere using a DTG-60A device manufactured by Shimadzu Corporation, and after maintaining at 170° C. for 2 hours, the weight loss rate was measured.

(7) Measurement of Peak-To-Valley Difference

Ti having a thickness of 200 nm and Cu having a thickness of 400 nm were sputtered in this order onto a 6-inch silicon wafer (manufactured by Fujimi Electronics Industry Co., Ltd., thickness 625±25 µm) using a sputtering device (Model L-440S-FHL, manufactured by Canon Anelva Corporation). Subsequently, the resin composition of Comparative Example 1 mentioned later was spin-coated on this wafer using a coater developer (model D-Spin 60A, manufactured by SOKUDO Co., Ltd.), and prebaked on a hot plate at 110° C. for 180 seconds to form a coating film having a final thickness of about 15 microns. Using a test patterned mask, the coating film was irradiated with energy of 400 mJ/cm² by a Prisma GHI (manufactured by Ultratech Inc). The coating was then spray-developed with cyclopentanone as a developer by a coater developer (Model D-Spin 60A, manufactured by SOKUDO Co., Ltd.) in a time calculated by multiplying the time required for the unexposed area to be completely dissolved and disappeared by 1.4, and subjected to rotary spray rinsing with propylene glycol methyl ether acetate for 10 seconds to obtain a relief pattern on Cu. The wafer on which the relief pattern on Cu was formed was subjected to a heat treatment in a nitrogen atmosphere at 230° C. for 2 hours, using a temperature programmed curing furnace (Model VF-2000, manufactured by Koyo Lindberg Co., Ltd.) to obtain a cured relief pattern made of a resin having a thickness of about 15 μm on Cu. Each of the photosensitive resin compositions obtained in the Examples and Comparative Examples was similarly spin-coated on the obtained relief pattern using a coater developer (Model D-Spin 60A, manufactured by SOKUDO Co., Ltd.), and prebaked on a hot plate at 110° C. for 180 seconds to form a coating film. The obtained coating film was subjected to a heat treatment in a nitrogen atmosphere at the temperature shown in Table 1 for 2 hours, using a temperature programmed curing furnace (Model VF-2000, manufactured by Koyo Lindberg Co., Ltd.) to obtain a cured film made of a resin having a thickness of about 5 μm on the relief pattern of the cured product of Comparative Example 1. A 25 μm via of the obtained cured film was cut in a cross-section by a FIB device (JIB-4000, manufactured by JEOL Ltd.), and the peak-to-valley difference from the surface was measured.

(8) Measurement of Elongation

A 6-inch silicon wafer substrate having an aluminum deposition layer on the outermost surface thereof was spin-coated with each of the photosensitive resin compositions obtained in the Examples and Comparative Examples to have a thickness of about 5 μm after curing, and then heated in a nitrogen atmosphere at 170° C. for 2 hours to obtain a resin cured film. The obtained resin cured film was cut into a width of 3 mm by a dicing saw and then separated from the wafer by a treatment with an aqueous dilute hydrochloric acid solution to obtain 20 samples. After leaving each sample to stand for 24 hours or more in an atmosphere of a temperature of 23° C. and a relative humidity of 50%, the elongation (%) was measured by a tensile tester (for example, TENSILON). The measurement conditions of the tensile tester were as follows:

Temperature: 23° C.
Relative humidity: 50%
Initial sample length: 50 mm
Testing speed: 40 mm/min
Load cell rating: 2 kgf (9) Evaluation of Chemical Resistance of Cured Relief Pattern (Polyimide Coating Film)

The cured relief pattern formed on Cu was immersed for 5 minutes in a resist stripping solution {manufactured by ATMI, Inc., product name ST-44, main components: 2-(2-aminoethoxy)ethanol, 1-cyclohexyl-2-pyrrolidone} which had been heated to 50° C., washed with running water for 1 minute, and then air-dried. Thereafter, the film surface was visually observed by an optical microscope, and the chemical resistance was evaluated by the presence or absence of damage due to the chemical solution, such as cracks, or the thickness change rate after the chemical solution treatment. The chemical resistance was evaluated by the following evaluation criteria.

Those in which cracks did not generate and the thickness change rate was 10% or less based on the thickness before chemical immersion were rated as "Excellent".

Those in which cracks did not generate and the thickness change rate was more than 10% and 15% or less were rated as "Good".

Those in which cracks did not generate and the thickness change rate was more than 15% and 20% or less were rated as "Fair".

Those in which cracks generated or the thickness change rate was more than 20% were rated as "Poor".

(10) Reflow Conditions

A 6-inch silicon wafer substrate having a copper deposition layer on the outermost surface thereof was spin-coated with each of the photosensitive resin compositions obtained in the Examples and Comparative Examples to have a thickness of about 5 μm after curing, and then heated in a nitrogen atmosphere at 170° C. for 2 hours to obtain a resin cured film. The obtained resin cured film was heated to a peak temperature of 260° C. in a nitrogen atmosphere under simulated solder reflow conditions using a mesh belt type continuous firing furnace (Model name: 6841-20AMC-36, manufactured by Koyo Thermo Systems Co., Ltd.). The simulated reflow conditions are solder reflow conditions that conform to the solder reflow conditions mentioned in Section 7.6 of IPC/JEDEC J-STD-020A, which is a standard of U.S. Semiconductor Industry Association regarding the evaluation method of semiconductor devices, and were standardized assuming the solder melting point as a high temperature of 220° C.

Example 1

Synthesis of Polymer A-1 as (A) Polyimide Precursor 10.5 g (0.1 mol) of 1-aminoethoxyethanol (AEE) and 26.0 g of γ-butyrolactone were charged in a 100 mL three-necked flask, followed by cooling to 0° C. To this, 15.5 g (0.1 mol) of Karenz MOI (registered trademark, Showa Denko K.K.) was added dropwise as an isocyanate compound to obtain a γ-butyrolactone solution of a urea compound U-1. The volatilization rate of the urea compound U-1 after heating at 170° C. for 2 hours was 15%.

62.0 g (0.2 mol) of 4,4'-oxydiphthalic dianhydride (ODPA) was charged in a 1 L volume separable flask, and 74.9 g of γ-butyrolactone was added. Next, 41.6 g (U-1: 0.08 mol) of a γ-butyrolactone solution of U-1 and 41.6 g of 2-hydroxyethyl methacrylate (hereinafter referred to as HEMA, 0.32 mol) were charged, and 31.6 g (0.4 mol) of pyridine was added while stirring. Thereafter, the mixture was stirred at 40° C. for 5 hours using an oil bath to obtain a reaction mixture. After completion of the reaction, the reaction mixture was allowed to cool to room temperature and left to stand for 16 hours.

Next, while stirring the obtained reaction mixture, a solution prepared by dissolving 81.3 g (0.39 mol) of dicyclohexylcarbodiimide (DCC) in 100 g of γ-butyrolactone was added over 40 minutes under ice-cooling, and subsequently, a suspension prepared by suspending 33.3 g (0.17 mol) of diaminodiphenyl ether (hereinafter referred to as DADPE) in 300 g of γ-butyrolactone was added over 60 minutes. After stirring at room temperature for 2 hours, 18 g of ethyl alcohol was added, and after stirring for 1 hour, 140 g of γ-butyrolactone was added. The reaction mixture was filtered to remove the precipitate formed in the reaction system to obtain a reaction solution.

The obtained reaction solution was added to 1.2 kg of ethyl alcohol to precipitate a crude polymer. The precipitated crude polymer was collected by filtration and then dissolved in 600 g of γ-butyrolactone to obtain a crude polymer solution. The obtained crude polymer solution was added dropwise to 7 kg of water to reprecipitate the polymer. The obtained reprecipitate was collected by filtration and then vacuum-dried to obtain a powdery polymer (polymer A-1). When the molecular weight of the polymer A-1 was measured by gel permeation chromatography (standard polystyrene equivalent), the weight-average molecular weight (Mw) was 29,000.

Example 2

Synthesis of Polymer A-2 as (A) Polyimide Precursor

The reaction was carried out in the same manner as in the method mentioned in Example 1, except that the amount of DADPE of Example 1 was changed to 35.6 g (0.18 mol), to obtain a polymer A-2. When the molecular weight of the polymer A-2 was measured by gel permeation chromatography (standard polystyrene equivalent), the weight-average molecular weight (Mw) was 40,000.

Example 3

Synthesis of Polymer A-3 as (A) Polyimide Precursor

The reaction was carried out in the same manner as in the method mentioned in Example 1, except that 21.8 g (0.1 mol) of pyromellitic anhydride (hereinafter referred to as PMDA) and 31.0 g (0.1 mol) of 4,4'-oxydiphthalic dianhydride (ODPA) were used instead of 62.0 g (0.2 mol) of ODPA of Example 1, to obtain a polymer A-3. When the molecular weight of the polymer A-3 was measured by gel permeation chromatography (standard polystyrene equivalent), the weight-average molecular weight (Mw) was 30,000.

Example 4

Synthesis of Polymer A-4 as (A) Polyimide Precursor

The reaction was carried out in the same manner as in the method mentioned in Example 1, except that 58.8 g (0.2 mol) of biphenyl-3,4,3',4'-tetracarboxylic dianhydride (hereinafter referred to as BPDA) was used instead of 62.0 g (0.2 mol) of 4,4'-oxydiphthalic dianhydride (ODPA) of Example 1, to obtain a polymer A-4. When the molecular weight of the polymer A-4 was measured by gel permeation chromatography (standard polystyrene equivalent), the weight-average molecular weight (Mw) was 29,000.

Example 5

Synthesis of Polymer A-5 as (A) Polyimide Precursor

The reaction was carried out in the same manner as in the method mentioned in Example 1, except that 35.4 g (0.17 mol) of m-tolidine was used instead of 33.3 g (0.17 mol) of DADPE of Example 1, to obtain a polymer A-5. When the molecular weight of the polymer A-5 was measured by gel permeation chromatography (standard polystyrene equivalent), the weight-average molecular weight (Mw) was 29,000.

Example 6

Synthesis of Polymer A-6 as (A) Polyimide Precursor 10.5 g (0.1 mol) of 1-aminoethoxyethanol (AEE) and 24.6 g of γ-butyrolactone were charged in a 100 mL three-necked flask, followed by cooling to 0° C. To this, 14.1 g (0.1 mol) of Karenz AOI (registered trademark, Showa Denko K.K.) was added dropwise to obtain a γ-butyrolactone solution of a urea compound U-2. The volatilization rate of the urea compound U-2 after heating at 170° C. for 2 hours was 17%.

The reaction was carried out in the same manner as in the method mentioned in Example 1, except that 39.4 g (U-2: 0.08 mol) of a γ-butyrolactone solution of a urea compound U-2 was used instead of 41.6 g of the γ-butyrolactone solution of the urea compound U-1 of Example 1, to obtain a polymer A-6. When the molecular weight of the polymer A-6 was measured by gel permeation chromatography (standard polystyrene equivalent), the weight-average molecular weight (Mw) was 28,000.

Example 7

Synthesis of Polymer A-7 as (A) Polyimide Precursor 10.5 g (0.1 mol) of 1-aminoethoxyethanol (AEE) and 30.4 g of γ-butyrolactone were charged in a 100 mL three-necked flask, followed by cooling to 0° C. To this, 19.9 g (0.1 mol) of Karenz MOI-EG (registered trademark, Showa Denko K.K.) was added dropwise to obtain a γ-butyrolactone solution of a urea compound U-3. The volatilization rate of the urea compound U-3 after heating at 170° C. for 2 hours was 14%.

The reaction was carried out in the same manner as in the method mentioned in Example 1, except that 48.7 g (U-3: 0.08 mol) of a γ-butyrolactone solution of a urea compound U-3 was used instead of 41.6 g of the γ-butyrolactone solution of the urea compound U-1 of Example 1, to obtain a polymer A-7. When the molecular weight of the polymer A-7 was measured by gel permeation chromatography (standard polystyrene equivalent), the weight-average molecular weight (Mw) was 30,000.

Example 8

Synthesis of Polymer A-8 as (A) Polyimide Precursor 10.5 g (0.1 mol) of 1-aminoethoxyethanol (AEE) and 34.4 g of γ-butyrolactone were charged in a 100 mL three-necked flask, followed by cooling to 0° C. To this, 23.9 g (0.1 mol) of Karenz BEI (registered trademark, Showa Denko K.K.) was added dropwise to obtain a γ-butyrolactone solution of a urea compound U-4.

The reaction was carried out in the same manner as in the method mentioned in Example 1, except that 55.1 g (U-4: 0.08 mol) of a γ-butyrolactone solution of a urea compound U-4 was used instead of 41.6 g of the γ-butyrolactone solution of the urea compound U-1 of Example 1, to obtain a polymer A-8. When the molecular weight of the polymer A-8 was measured by gel permeation chromatography (standard polystyrene equivalent), the weight-average molecular weight (Mw) was 29,000.

Example 9

Synthesis of Polymer A-9 as (A) Polyimide Precursor

The reaction was carried out in the same manner as in the method mentioned in Example 1, except that the amount of the γ-butyrolactone solution of the urea compound U-1 of Example 1 was changed to 10.4 g (U-1: 0.02 mol) and the amount of HEMA was changed to 49.5 g (0.38 mol), to obtain a polymer A-9. When the molecular weight of the polymer A-9 was measured by gel permeation chromatography (standard polystyrene equivalent), the weight-average molecular weight (Mw) was 29,000.

Example 10

Synthesis of Polymer A-10 as (A) Polyimide Precursor

The reaction was carried out in the same manner as in the method mentioned in Example 1, except that the amount of the γ-butyrolactone solution of the urea compound U-1 of Example 1 was changed to 197.8 g (U-1: 0.38 mol) and the amount of HEMA was changed to 2.6 g (0.02 mol), to obtain a polymer A-10. When the molecular weight of the polymer A-10 was measured by gel permeation chromatography (standard polystyrene equivalent), the weight-average molecular weight (Mw) was 30,000.

Example 11

Synthesis of Polymer A-11 as (A) Polyimide Precursor

The reaction was carried out in the same manner as in the method mentioned in Example 1, except that the amount of the γ-butyrolactone solution of the urea compound U-1 of Example 1 was changed to 208.2 g (U-1: 0.4 mol) and HEMA was not charged, to obtain a polymer A-11. When the molecular weight of the polymer A-11 was measured by gel permeation chromatography (standard polystyrene equivalent), the weight-average molecular weight (Mw) was 30,000.

Example 12

Synthesis of Polymer A-12 as (A) Polyimide Precursor 10.5 g (0.1 mol) of 1-aminoethoxyethanol (AEE) and 23.2 g of γ-butyrolactone were charged in a 100 mL three-necked flask, followed by cooling to 0° C. To this, 12.7 g (0.1 mol) of n-hexyl isocyanate was added dropwise to obtain a γ-butyrolactone solution of a urea compound U-5. The volatilization rate of the urea compound U-5 after heating at 170° C. for 2 hours was 40%.

The reaction was carried out in the same manner as in the method mentioned in Example 1, except that 37.2 g (U-5: 0.08 mol) of a γ-butyrolactone solution of a urea compound U-5 was used instead of 41.6 g of the γ-butyrolactone solution of the urea compound U-1 of Example 1, to obtain a polymer A-12. When the molecular weight of the polymer A-12 was measured by gel permeation chromatography (standard polystyrene equivalent), the weight-average molecular weight (Mw) was 28,000.

Example 13

Synthesis of Polymer A-13 as (A) Polyimide Precursor 5.78 g (0.077 mol) of N-methylethanolamine (MEA) and 41.0 g of γ-butyrolactone were charged in a 100 mL three-necked flask, followed by cooling to 0° C. To this, 11.95 g (0.077 mol) of Karenz MOI (registered trademark, Showa Denko K.K.) was added dropwise as an isocyanate compound to obtain a γ-butyrolactone solution of a urea compound U-6. The volatilization rate of the urea compound U-6 after heating at 170° C. for 2 hours was 30%.

31.0 g (0.1 mol) of 4,4'-oxydiphthalic dianhydride (ODPA) was charged in a 1 L volume separable flask, and 74.9 g of γ-butyrolactone was added. Next, 58.7 g (U-6: 0.077 mol) of a γ-butyrolactone solution of U-6 and 16.79 g of 2-hydroxyethyl methacrylate (hereinafter referred to as HEMA, 0.13 mol) were charged, and 15.82 g of pyridine was added while stirring. Thereafter, the mixture was stirred at 40° C. for 5 hours using an oil bath to obtain a reaction mixture. After completion of the reaction, the reaction mixture was allowed to cool to room temperature and left to stand for 16 hours.

Next, while stirring the obtained reaction mixture, a solution prepared by dissolving 40.44 g (0.196 mol) of dicyclohexylcarbodiimide (DCC) in 50 g of γ-butyrolactone was added over 40 minutes under ice-cooling, and subsequently, a solution prepared by dissolving 8.85 g (0.042 mol) of m-tolidine in 30 g of γ-butyrolactone was added over 40 minutes, and subsequently, a suspension prepared by suspending 8.34 g (0.042 mol) of DADPE in 30 g of γ-butyrolactone was added over 40 minutes. After stirring at room temperature for 2 hours, 9 g of ethyl alcohol was added, and after stirring for 1 hour, 70 g of γ-butyrolactone was added. The reaction mixture was filtered to remove the precipitate formed in the reaction system to obtain a reaction solution.

The obtained reaction solution was added to 600 g of ethyl alcohol to precipitate a crude polymer. The precipitated crude polymer was collected by filtration and then dissolved in 300 g of γ-butyrolactone to obtain a crude polymer solution. The obtained crude polymer solution was added dropwise to 3.5 kg of water to reprecipitate the polymer. The obtained reprecipitate was collected by filtration and then vacuum-dried to obtain a powdery polymer (polymer A-13). When the molecular weight of the polymer A-13 was measured by gel permeation chromatography (standard polystyrene equivalent), the weight-average molecular weight (Mw) was 23,000.

Example 14

Synthesis of Polymer A-14 as (A) Polyimide Precursor

The reaction was carried out in the same manner as in the method mentioned in Example 13, except that 11.64 g (0.077 mol) of N-benzyl ethanolamine (hereinafter referred to as NBEA) was used instead of 5.78 g (0.077 mol) of MEA of Example 13, to obtain a γ-butyrolactone solution of a urea compound U-7 and a polymer A-14. When the molecular weight of the polymer A-14 was measured by gel permeation chromatography (standard polystyrene equivalent), the weight-average molecular weight (Mw) was 23,000. The volatilization rate of the urea compound U-7 after heating at 170° C. for 2 hours was 30%.

Example 15

Synthesis of Polymer A-15 as (A) Polyimide Precursor

The reaction was carried out in the same manner as in the method mentioned in Example 1, except that 68.3 g (0.17 mol) of 2,2-bis[4-(4-aminophenoxy)phenyl]propane (hereinafter referred to as BAPP) was used instead of 33.3 g (0.17 mol) of DADPE of Example 1, to obtain a polymer A-15. When the molecular weight of the polymer A-15 was measured by gel permeation chromatography (standard polystyrene equivalent), the weight-average molecular weight (Mw) was 25,000.

Example 16

Synthesis of Polymer A-16 as (A) Polyimide Precursor

The reaction was carried out in the same manner as in the method mentioned in Example 1, except that 104.0 g (0.2 mol) of 4,4'-(4,4'-isopropylidenediphenoxy)diphthalic anhydride was used instead of 62.0 g (0.2 mol) of ODPA of Example 1, to obtain a polymer A-16. When the molecular weight of the polymer A-16 was measured by gel permeation chromatography (standard polystyrene equivalent), the weight-average molecular weight (Mw) was 24,000.

Example 17

Synthesis of Polymer A-17 as (A) Polyimide Precursor 10.5 g (0.1 mol) of 1-aminoethoxyethanol (AEE) and 26.0 g of γ-butyrolactone were charged in a 100 mL three-necked flask, followed by cooling to 0° C. To this, 15.5 g (0.1 mol) of Karenz MOI (registered trademark, Showa Denko K.K.) was added dropwise as an isocyanate compound to obtain a γ-butyrolactone solution of a urea compound U-1. The volatilization rate of the urea compound U-1 after heating at 170° C. for 2 hours was 15%.

49.6 g (0.16 mol) of ODPA was charged in a 1 L volume separable flask, and 50.0 g of γ-butyrolactone was added. Next, 41.7 g (0.32 mol) of HEMA was charged and 25.3 g (0.32 mol) of pyridine was added while stirring. Thereafter, the mixture was stirred at 40° C. for 5 hours using an oil bath to obtain a reaction mixture A. After completion of the reaction, the reaction mixture was allowed to cool to room temperature and left to stand for 16 hours.

11.8 g (0.04 mol) of BPDA was charged in a 1 L volume separable flask, and 15.0 g of γ-butyrolactone was added. Next, 41.6 g (U-1: 0.08 mol) of a γ-butyrolactone solution of U-1 was charged, and 6.32 g (0.08 mol) of pyridine was added while stirring. Thereafter, the mixture was stirred at 40° C. for 5 hours using an oil bath to obtain a reaction mixture B. After completion of the reaction, the reaction mixture was allowed to cool to room temperature and left to stand for 16 hours.

While stirring the mixture of the obtained reaction mixture A and the obtained reaction mixture B, a solution prepared by dissolving 81.3 g (0.39 mol) of dicyclohexylcarbodiimide (DCC) in 100 g of γ-butyrolactone was added over 40 minutes under ice-cooling, and subsequently, a suspension prepared by suspending 33.3 g (0.17 mol) of diaminodiphenyl ether (hereinafter referred to as DADPE) in 300 g of γ-butyrolactone was added over 60 minutes. After stirring at room temperature for 2 hours, 18 g of ethyl alcohol was added, and after stirring for 1 hour, 140 g of γ-butyrolactone was added. The reaction mixture was filtered to remove the precipitate formed in the reaction system to obtain a reaction solution.

The obtained reaction solution was added to 1.2 kg of ethyl alcohol to precipitate a crude polymer. The precipitated crude polymer was collected by filtration and then dissolved in 600 g of γ-butyrolactone to obtain a crude polymer solution. The obtained crude polymer solution was added dropwise to 7 kg of water to reprecipitate the polymer. The obtained reprecipitate was collected by filtration and then vacuum-dried to obtain a powdery polymer (polymer A-17). When the molecular weight of the polymer A-17 was measured by gel permeation chromatography (standard polystyrene equivalent), the weight-average molecular weight (Mw) was 26,000.

Production Example 1

Synthesis of Polymer A-18 as (A) Polyimide Precursor 62.0 g (0.2 mol) of ODPA was charged in a 1 L volume separable flask, and 74.9 g of γ-butyrolactone was added. Next, 52.1 g (0.4 mol) of HEMA was charged, and 31.6 g (0.4 mol) of pyridine was added while stirring. Thereafter, the mixture was stirred at 40° C. for 5 hours using an oil bath to obtain a reaction mixture. After completion of the reaction, the reaction mixture was allowed to cool to room temperature and left to stand for 16 hours.

Next, while stirring the obtained reaction mixture, a solution prepared by dissolving 81.3 g (0.39 mol) of DCC in 100 g of γ-butyrolactone was added over 40 minutes under ice-cooling, and subsequently, a suspension prepared by suspending 33.3 g (0.17 mol) of DADPE in 300 g of γ-butyrolactone was added over 60 minutes. After stirring at room temperature for 2 hours, 18 g of ethyl alcohol was added, and after stirring for 1 hour, 140 g of γ-butyrolactone was added. The reaction mixture was filtered to remove the precipitate formed in the reaction system to obtain a reaction solution.

The obtained reaction solution was added to 1.2 kg of ethyl alcohol to precipitate a crude polymer. The precipitated crude polymer was collected by filtration and then dissolved in 600 g of γ-butyrolactone to obtain a crude polymer solution. The obtained crude polymer solution was added dropwise to 7 kg of water to reprecipitate the polymer. The obtained reprecipitate was collected by filtration and then vacuum-dried to obtain a powdery polymer (polymer A-18). When the molecular weight of the polymer A-18 was measured by gel permeation chromatography (standard polystyrene equivalent), the weight-average molecular weight (Mw) was 29,000.

Example 18

A negative photosensitive resin composition was prepared by the following method, and the evaluation of the composition thus prepared was carried out. 100 g of A-1 as the polyimide precursor (A), 3 g of 1-phenyl-1,2-propanedione-2-(O-ethoxycarbonyl)-oxime (hereinafter referred to as PDO, B-1) as the photopolymerization initiator (B), 8 g of polyethylene glycol dimethacrylate (C-1) as the photopolymerizable monomer (C), and 0.5 g of adenine (D-1) as the rust inhibitor (D) were dissolved in 100 g of γ-butyrolactone (hereinafter referred to as GBL). The viscosity of the obtained solution was adjusted to about 40 poise by further adding a small amount of GBL to prepare a negative photosensitive resin composition. The composition was evaluated in accordance with the methods mentioned above. The results are shown in Table 1.

Examples 19 to 35, Comparative Example 1

Negative photosensitive resin compositions were prepared in the same manner as in Example 18, except that the polymers as shown in Table 1 were used, and the evaluation was carried out in the same manner as in Example 18. The results are shown in Table 1. In Table 1, the urea compound E-1 is a compound represented by the following chemical formula:

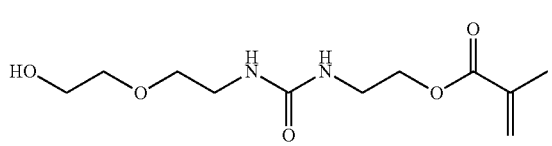 [SMILES: C=C(C)C(=O)OCCNC(=O)NCCOCCO]

Example 36

A negative photosensitive resin composition was prepared by the following method, and the evaluation of the composition thus prepared was carried out. 100 g of A-1 as the polyimide precursor (A), 3 g of 3-cyclopentyl-1-[9-ethyl-6-(2-methylbenzoyl)-9H-carbazol yl]propanone-1-(O-acetyloxime) (trade name: PBG-304, manufactured by CHANGZHOU TRONLY ELECTRONICS CO., LTD.) (hereinafter referred to as PBG-304, B-2) as the photopolymerization initiator (B), 8 g of polyethylene glycol dimethacrylate (C-1) as the photopolymerizable monomer (C), and 0.5 g of adenine (D-1) as the rust inhibitor (D) were dissolved in 100 g of γ-butyrolactone (hereinafter referred to as GBL). The viscosity of the obtained solution was adjusted to about 40 poise by further adding a small amount of GBL to prepare a negative photosensitive resin composition. The composition was evaluated in accordance with the methods mentioned above. The results are shown in Table 2.

Example 37

The evaluation was carried out in the same manner as in Example 36, except that the photopolymerization initiator (B) of Example 36 was changed to 1,2-propanedione-3-cyclopentyl-1-[4-(phenylthio) phenyl]-2-(Obenzoyloxime) (trade name: PBG-305, manufactured by CHANGZHOU TRONLY ELECTRONICS CO., LTD.). The results are shown in Table 2.

Examples 38 to 41, Comparative Example 2

Negative photosensitive resin compositions were prepared in the same manner as in Example 36, except for the compositions shown in Table 2, and the evaluation was carried out in the same manner as in Example 36. The results are shown in Table 2.

Example 42

100 g of A-13 as the polyimide precursor (A), 3 g of B-2 as the photopolymerization initiator (B), 8 g of polyethylene glycol dimethacrylate (C-1) as the photopolymerizable monomer (C), and 0.5 g of adenine (D-1) as the rust inhibitor (D) were dissolved in 100 g of γ-butyrolactone (hereinafter referred to as GBL). The viscosity of the obtained solution was adjusted to about 40 poise by further adding a small amount of GBL to prepare a negative photosensitive resin composition. When the above-mentioned peak-to-valley difference measurement and evaluation of this composition were carried out, the imidization rate after heat-curing at 2.0 microns and 170° C. was 100%. When the polyimide film after reflowing was observed using this cured product, neither cracks nor peeling generated. When a fan-out wafer level chip size package semiconductor device was fabricated, it functioned without any problem.

Comparative Example 3

A resin composition was prepared and evaluated in the same manner as in Example 42, except that A-18 was used as the polyimide precursor. The peak-to-valley difference was 0.4 microns, and the imidization rate was 20%. When the polyimide film after reflowing was observed using this cured product, cracks and peeling generated.

Comparative Example 4

A resin composition was prepared and evaluated in the same manner as in Comparative Example 3, except that 20 g of 1-(tert-butoxycarbonyl)-4-piperidinemethanol (manufactured by Tokyo Chemical Industry Co., Ltd.) was added as an imidization accelerator in addition to the composition of Comparative Example 3. The peak-to-valley difference was 4.1 microns, and the imidization rate was 100%. When the polyimide film after reflowing was observed using this cured product, neither cracks nor peeling generated. However, when a fan-out wafer level chip size package semiconductor device was fabricated, it did not function.

TABLE 1

| | | Example 18 | Example 19 | Example 20 | Example 21 | Example 22 |
|---|---|---|---|---|---|---|
| Polyimide precursor | A-1 | 100 | 100 | | | |
| | A-2 | | | 100 | | |
| | A-3 | | | | 100 | |
| | A-4 | | | | | 100 |
| | A-5 | | | | | |
| | A-6 | | | | | |
| | A-7 | | | | | |
| | A-8 | | | | | |
| | A-9 | | | | | |
| | A-10 | | | | | |
| | A-11 | | | | | |
| | A-12 | | | | | |
| | A-13 | | | | | |
| | A-14 | | | | | |
| | A-15 | | | | | |
| | A-16 | | | | | |
| | A-17 | | | | | |
| | A-18 | | | | | |
| Photopolymerization initiator | B-1 | 3 | 3 | 3 | 3 | 3 |
| Photopolymerizable monomer | C-1 | 8 | 8 | 8 | 8 | 8 |
| Rust inhibitor | D-1 | 0.5 | 0.5 | 0.5 | 0.5 | 0.5 |
| Urea compound | E-1 | | 10 | | | |
| Curing temperature (° C.) | | 170 | 170 | 170 | 170 | 170 |
| Imidization rate (%) | | Good | Excellent | Good | Good | Good |
| Evaluation of copper adhesion | | Excellent | Excellent | Excellent | Excellent | Excellent |
| Resolution | | Excellent | Excellent | Good | Excellent | Excellent |

TABLE 1-continued

|  |  | Example 23 | Example 24 | Example 25 | Example 26 | Example 27 |
|---|---|---|---|---|---|---|
| Polyimide precursor | A-1 |  |  |  |  |  |
|  | A-2 |  |  |  |  |  |
|  | A-3 |  |  |  |  |  |
|  | A-4 |  |  |  |  |  |
|  | A-5 | 100 |  |  |  |  |
|  | A-6 |  | 100 |  |  |  |
|  | A-7 |  |  | 100 |  |  |
|  | A-8 |  |  |  | 100 |  |
|  | A-9 |  |  |  |  | 100 |
|  | A-10 |  |  |  |  |  |
|  | A-11 |  |  |  |  |  |
|  | A-12 |  |  |  |  |  |
|  | A-13 |  |  |  |  |  |
|  | A-14 |  |  |  |  |  |
|  | A-15 |  |  |  |  |  |
|  | A-16 |  |  |  |  |  |
|  | A-17 |  |  |  |  |  |
|  | A-18 |  |  |  |  |  |
| Photopolymerization initiator | B-1 | 3 | 3 | 3 | 3 | 3 |
| Photopolymerizable monomer | C-1 | 8 | 8 | 8 | 8 | 8 |
| Rust inhibitor | D-1 | 0.5 | 0.5 | 0.5 | 0.5 | 0.5 |
| Urea compound | E-1 |  |  |  |  |  |
| Curing temperature (° C.) |  | 170 | 170 | 170 | 170 | 170 |
| Imidization rate (%) |  | Good | Good | Good | Good | Fair |
| Evaluation of copper adhesion |  | Excellent | Excellent | Excellent | Excellent | Fair |
| Resolution |  | Excellent | Excellent | Excellent | Excellent | Excellent |

|  |  | Example 28 | Example 29 | Example 30 | Example 31 | Example 32 |
|---|---|---|---|---|---|---|
| Polyimide precursor | A-1 |  |  |  |  |  |
|  | A-2 |  |  |  |  |  |
|  | A-3 |  |  |  |  |  |
|  | A-4 |  |  |  |  |  |
|  | A-5 |  |  |  |  |  |
|  | A-6 |  |  |  |  |  |
|  | A-7 |  |  |  |  |  |
|  | A-8 |  |  |  |  |  |
|  | A-9 |  |  |  |  |  |
|  | A-10 | 100 |  |  |  |  |
|  | A-11 |  | 100 |  |  |  |
|  | A-12 |  |  | 100 |  |  |
|  | A-13 |  |  |  | 100 |  |
|  | A-14 |  |  |  |  | 100 |
|  | A-15 |  |  |  |  |  |
|  | A-16 |  |  |  |  |  |
|  | A-17 |  |  |  |  |  |
|  | A-18 |  |  |  |  |  |
| Photopolymerization initiator | B-1 | 3 | 3 | 3 | 3 | 3 |
| Photopolymerizable monomer | C-1 | 8 | 8 | 8 | 8 | 8 |
| Rust inhibitor | D-1 | 0.5 | 0.5 | 0.5 | 0.5 | 0.5 |
| Urea compound | E-1 |  |  |  |  |  |
| Curing temperature (° C.) |  | 170 | 170 | 170 | 170 | 170 |
| Imidization rate (%) |  | Excellent | Excellent | Good | Excellent | Excellent |
| Evaluation of copper adhesion |  | Excellent | Excellent | Excellent | Excellent | Fair |
| Resolution |  | Good | Fair | Fair | Good | Fair |

|  |  | Example 33 | Example 34 | Example 35 | Comparative Example 1 |
|---|---|---|---|---|---|
| Polyimide precursor | A-1 |  |  |  |  |
|  | A-2 |  |  |  |  |
|  | A-3 |  |  |  |  |
|  | A-4 |  |  |  |  |
|  | A-5 |  |  |  |  |
|  | A-6 |  |  |  |  |
|  | A-7 |  |  |  |  |
|  | A-8 |  |  |  |  |
|  | A-9 |  |  |  |  |
|  | A-10 |  |  |  |  |
|  | A-11 |  |  |  |  |

TABLE 1-continued

|  |  |  |  |  |  |
|---|---|---|---|---|---|
| A-12 |  |  |  |  |
| A-13 |  |  |  |  |
| A-14 |  |  |  |  |
| A-15 | 100 |  |  |  |
| A-16 |  | 100 |  |  |
| A-17 |  |  | 100 |  |
| A-18 |  |  |  | 100 |
| Photopolymerization initiator B-1 | 3 | 3 | 3 | 3 |
| Photopolymerizable monomer C-1 | 8 | 8 | 8 | 8 |
| Rust inhibitor D-1 | 0.5 | 0.5 | 0.5 | 0.5 |
| Urea compound E-1 |  |  |  |  |
| Curing temperature (° C.) | 170 | 170 | 170 | 170 |
| Imidization rate (%) | Excellent | Excellent | Good | Poor |
| Evaluation of copper adhesion | Excellent | Excellent | Excellent | Poor |
| Resolution | Good | Good | Excellent | Good |

TABLE 2

|  |  | Example 36 | Example 37 | Example 38 | Example 39 | Example 40 | Example 41 | Comparative Example 2 |
|---|---|---|---|---|---|---|---|---|
| Polyimide precursor | A-1 | 100 | 100 |  |  |  |  |  |
|  | A-6 |  |  | 100 |  |  |  |  |
|  | A-7 |  |  |  | 100 |  |  |  |
|  | A-12 |  |  |  |  | 100 |  |  |
|  | A-13 |  |  |  |  |  | 100 |  |
|  | A-18 |  |  |  |  |  |  | 100 |
| Photopolymerization initiator | B-2 | 3 |  | 3 |  |  |  | 3 |
|  | B-3 |  | 3 |  |  |  |  |  |
| Photopolymerizable monomer | C-1 | 8 | 8 | 8 | 8 | 8 | 8 | 8 |
| Rust inhibitor | D-1 | 0.5 | 0.5 | 0.5 | 0.5 | 0.5 | 0.5 | 0.5 |
| Side chain R1 volatilization rate (%) |  | 15 | 15 | 17 | 14 | 40 | 30 | 98 |
| Curing temperature (° C.) |  | 170 | 170 | 170 | 170 | 170 | 170 | 170 |
| Chemical resistance |  | Excellent | Excellent | Excellent | Excellent | Fair | Good | Poor |
| Elongation (%) |  | 25 | 25 | 30 | 25 | 45 | 35 | 10 |

INDUSTRIAL APPLICABILITY

By using the negative photosensitive resin composition according to the present disclosure, it is possible to obtain a cured relief pattern which has high imidization rate and chemical resistance, and has high copper adhesion and less degassing in the heating step after heat-curing. The negative photosensitive resin composition of the present disclosure can be suitably used in the field of photosensitive materials useful for producing electric/electronic materials such as semiconductor devices and multilayer wiring boards.

The invention claimed is:

1. A negative photosensitive resin composition comprising:
   (A) a polyimide precursor having a structural unit represented by the following general formula (1), and
   (B) a photopolymerization initiator:

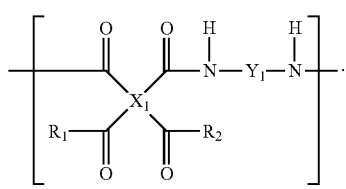

(1)

wherein, in formula (1), $X_1$ is a tetravalent organic group having 4 to 40 carbon atoms, $Y_1$ is a divalent organic group having 6 to 40 carbon atoms, and $R_1$ and $R_2$ are each independently selected from the group consisting of a hydroxyl group, a monovalent organic group having 1 to 40 carbon atoms and having no urea structure, and a monovalent organic group having a urea structure, in which at least one of $R_1$ and $R_2$ is the monovalent organic group having a urea structure.

2. The negative photosensitive resin composition according to claim 1, further comprising (A') a polyimide precursor having a structural unit represented by the following general formula (1'):

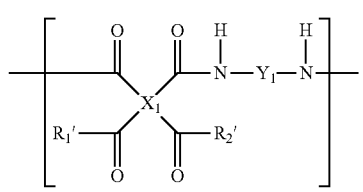

(1')

wherein, in formula (1'), $X_1$ is a tetravalent organic group having 4 to 40 carbon atoms, $Y_1$ is a divalent organic group having 6 to 40 carbon atoms, and $R_1'$ and $R_2'$ are each independently selected from the group consisting of a hydroxyl group and a monovalent organic group having 1 to 40 carbon atoms and having no urea structure.

3. The negative photosensitive resin composition according to claim 1, wherein the polyimide precursor (A) is a copolymer having a structural unit represented by the general formula (1) and a structural unit represented by the following general formula (1'):

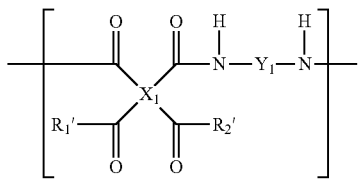

wherein, in formula (1'), $X_1$ is a tetravalent organic group having 4 to 40 carbon atoms, $Y_1$ is a divalent organic group having 6 to 40 carbon atoms, and $R_1'$ and $R_2'$ are each independently selected from the group consisting of a hydroxyl group and a monovalent organic group having 1 to 40 carbon atoms and having no urea structure.

4. The negative photosensitive resin composition according to claim 1, comprising the photopolymerization initiator (B) in the amount of 0.1 parts by weight to 20 parts by weight based on 100 parts by weight of the polyimide precursor (A), or based on 100 parts by weight of the total of the polyimide precursor (A) and the polyimide precursor (A') when the polyimide precursor (A') is contained.

5. The negative photosensitive resin composition according to claim 1, wherein any one of $R_1$ and $R_2$ in the polyimide precursor (A) is a monovalent organic group having a urea structure, and the other is a monovalent organic group having 1 to 40 carbon atoms and having no urea structure.

6. The negative photosensitive resin composition according to claim 1, wherein the ratio of the monovalent organic group having a urea structure in the polyimide precursor (A) is 0.1 mol % to 95 mol % relative to the total amount of $R_1$ and $R_2$.

7. The negative photosensitive resin composition according to claim 1, wherein the monovalent organic group having 1 to 40 carbon atoms and having no urea structure is represented by the following general formula (2):

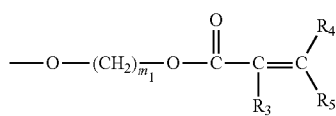

wherein $R_3$, $R_4$ and $R_5$ are each independently a hydrogen atom or an organic group having 1 to 3 carbon atoms, and $m_1$ is an integer of 2 to 10.

8. The negative photosensitive resin composition according to claim 1, wherein the monovalent organic group having a urea structure further has a (meth)acrylic group.

9. The negative photosensitive resin composition according to claim 1, wherein the monovalent organic group having a urea structure is represented by the following general formula (3):

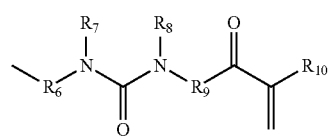

wherein $R_6$ and $R_9$ are each independently a divalent organic group having 1 to 10 carbon atoms, and $R_7$, $R_8$ and $R_{10}$ each independently represent a hydrogen atom or a monovalent organic group having 1 to 6 carbon atoms.

10. The negative photosensitive resin composition according to claim 1, wherein the monovalent organic group having a urea structure is at least one selected from the group consisting of the following general formulas (4) to (7):

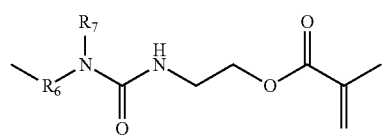

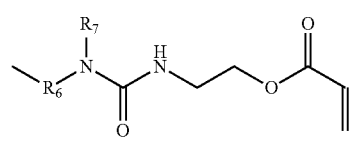

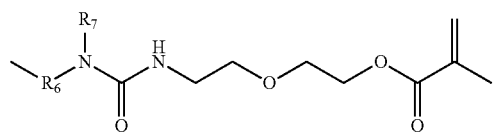

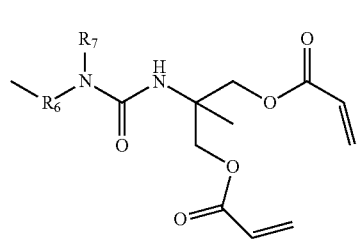

wherein $R_6$ is a divalent organic group having 1 to 10 carbon atoms, and $R_7$ is a hydrogen atom or a monovalent organic group having 1 to 10 carbon atoms.

11. The negative photosensitive resin composition according to claim 1, wherein the ratio of the monovalent organic group having a urea structure to the total amount of $R_1$ and $R_2$ in the polyimide precursor (A) is 5 mol % or more to 75 mol % or less.

12. The negative photosensitive resin composition according to claim 1, wherein the photopolymerization initiator (B) is an oxime compound.

13. The negative photosensitive resin composition according to claim 1, wherein the photopolymerization initiator (B) is represented by the following general formula (19) or (20):

(19)

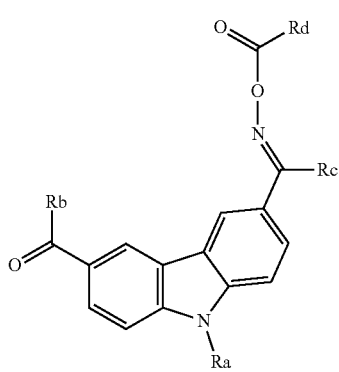

wherein Ra represents a monovalent organic group having 1 to 10 carbon atoms, Rb represents a monovalent organic group having 1 to 20 carbon atoms, Rc represents a monovalent organic group having 1 to 10 carbon atoms, and Rd represents a monovalent organic group having 1 to 10 carbon atoms; and (20)

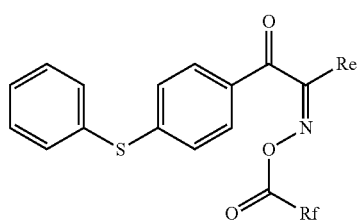

wherein Re represents a monovalent organic group having 1 to 20 carbon atoms, and Rf represents a monovalent organic group having 1 to 10 carbon atoms.

14. The negative photosensitive resin composition according to claim 1, further comprising (C) a photopolymerizable unsaturated monomer.

15. The negative photosensitive resin composition according to claim 1, wherein $X_1$ is at least one selected from the group consisting of the following general formulas (8) to (11):

(8)
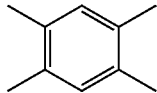

(9)
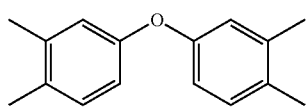

(10)
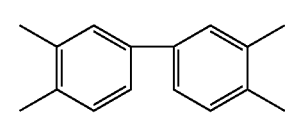

(11)
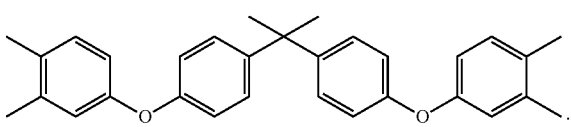

16. The negative photosensitive resin composition according to claim 1, wherein $Y_1$ is at least one selected from the group consisting of the following general formulas (12) to (15):

(12)
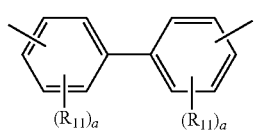

(13)
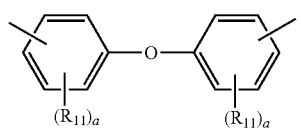

(14)
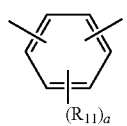

(15)
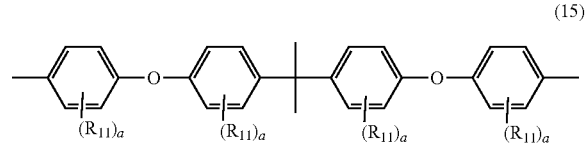

wherein $R_{11}$ is each independently a monovalent organic group having 1 to 10 carbon atoms, and a is each independently an integer of 0 to 4.

17. The negative photosensitive resin composition according to claim 1, further comprising (D) a rust inhibitor in the amount of 0.01 to 20 parts by weight based on 100 parts by weight of the polyimide precursor (A), or based on 100 parts by weight of the total of the polyimide precursor (A) and the polyimide precursor (A') when the polyimide precursor (A') is contained.

18. The negative photosensitive resin composition according to claim 1, further comprising (E) a compound having a urethane bond or a urea bond in the amount of 0.1 to 30 parts by weight based on 100 parts by weight of the polyimide precursor (A), or based on 100 parts by weight of the total of the polyimide precursor (A) and the polyimide precursor (A') when the polyimide precursor (A') is contained.

19. A method for producing a polyimide, which comprises curing the negative photosensitive resin composition according to claim 1 to form a polyimide.

20. A method for producing a cured relief pattern, which comprises:
(1) applying the negative photosensitive resin composition according to claim 1 onto a substrate to form a photosensitive resin layer on the substrate,
(2) exposing the photosensitive resin layer,
(3) developing the exposed photosensitive resin layer to form a relief pattern, and
(4) subjecting the relief pattern to a heat treatment to form a cured relief pattern.

21. The method for producing a cured relief pattern according to claim 20, wherein an imidization rate in the heat treatment at 150° C. to 250° C. is 60% or more.

22. A polyimide precursor having a structural unit represented by the following general formula (1):

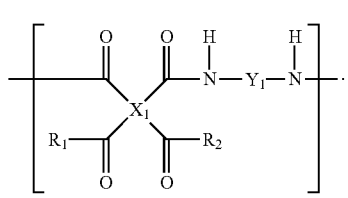
(1)

wherein, in formula (1), $X_1$ is a tetravalent organic group having 4 to 40 carbon atoms, $Y_1$ is a divalent organic group having 6 to 40 carbon atoms, and $R_1$ and $R_2$ are each independently selected from the group consisting of a hydroxyl group, a monovalent organic group having 1 to 40 carbon atoms and having no urea structure and a monovalent organic group having a urea structure, in which at least one of $R_1$ and $R_2$ is the monovalent organic group having a urea structure.

23. The polyimide precursor according to claim 22, wherein $X_1$ is at least one selected from the group consisting of the following general formulas (8) to (11), and $Y_1$ is at least one selected from the group consisting of the following general formulas (12) to (15):

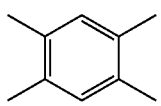
(8)

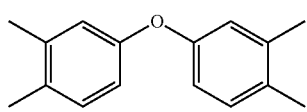
(9)

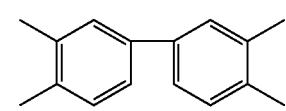
(10)

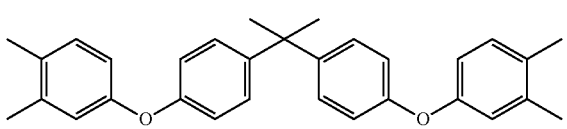
(11)

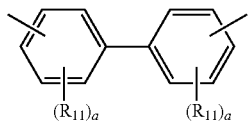
(12)

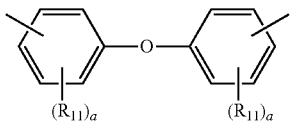
(13)

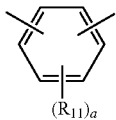
(14)

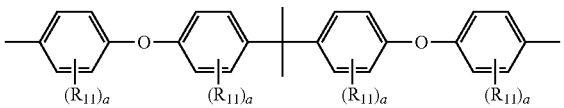
(15)

wherein $R_{11}$ is each independently a monovalent organic group having 1 to 10 carbon atoms, and a is each independently an integer of 0 to 4.

24. The polyimide precursor according to claim 22, wherein the monovalent organic group having a urea structure is represented by the following general formula (3):

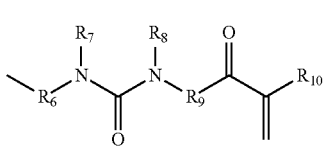
(3)

wherein $R_6$ and $R_9$ are each independently a divalent organic group having 1 to 10 carbon atoms, and $R_7$, $R_8$ and $R_{10}$ each independently represent a hydrogen atom or a monovalent organic group having 1 to 6 carbon atoms.

* * * * *